United States Patent [19]
Uchihashi et al.

[11] Patent Number: 5,951,785
[45] Date of Patent: Sep. 14, 1999

[54] PHOTO-VOLTAIC APPARATUS

[75] Inventors: Kenji Uchihashi, Amagasaki; Takeo Ishida; Hitoshi Kishi, both of Neyagawa; Ryuzo Hagihara, Kadoma, all of Japan

[73] Assignee: Sanyo Electric Co., Ltd., Osaka-fu, Japan

[21] Appl. No.: 08/790,116

[22] Filed: Jan. 29, 1997

[30] Foreign Application Priority Data

| Jan. 29, 1996 | [JP] | Japan | 8-013379 |
| Jan. 29, 1996 | [JP] | Japan | 8-013380 |
| Jan. 13, 1997 | [JP] | Japan | 9-003983 |

[51] Int. Cl.⁶ ............................................. H01L 25/00
[52] U.S. Cl. .................................... 136/251; 136/246
[58] Field of Search ................................ 136/251, 246

[56] References Cited

PUBLICATIONS

1994 IEEE First World Conference on Photovoltaic Energy Conversion, High–Performance Inverters for Grid–PV Applications, Dec. 5–9, 1994, pp. 913–928.

*Primary Examiner*—Mark Chapman
*Attorney, Agent, or Firm*—Darby & Darby

[57] ABSTRACT

The present invention is directed to a photo-voltaic apparatus comprising a photo-voltaic module having a plurality of photo-voltaic cells, and an inverter for converting a direct current output generated from the photo-voltaic cells into an alternating current and outputting the alternating current, the inverter being mounted on a surface opposite to the light receiving surface of the photo-voltaic module with a clearance provided therebetween, so that heat self-generated by the inverter can be efficiently radiated, and heat from the photo-voltaic module is not transferred to the inverter.

20 Claims, 19 Drawing Sheets

PHOTO-VOLTAIC APPARATUS

BACKGROUND OF THE INVENTION

1. Field of the Invention

The present invention relates generally to a photo-voltaic apparatus, and more particularly, to a photo-voltaic apparatus in which an inverter is integrated into a photo-voltaic module, to output an alternating current (AC).

2. Description of the Prior Art

In recent years, a photo-voltaic apparatus located outdoors for generating photo-voltaic power has been paid attention to from the globally environmental problem, and the photo-voltaic apparatus has been installed on a roof so that power generated by the photo-voltaic apparatus compensates for consumed power in the daytime.

Generally, the photo-voltaic apparatus is formed as a photo-voltaic module having suitable dimensions in order to make the manufacture thereof easy and make transportation to the location thereof easy. As shown in FIG. 28, a required number of photo-voltaic modules 102 are located on a located frame 101. Each of the photo-voltaic modules 102 is provided with a terminal box 103 in order to electrically connect the modules 102 to each other and take out an output.

Since power generated by the photo-voltaic module 102 is a direct current (DC) output, the output must be converted into an alternating current (AC) for use in a household power supply. As shown in FIG. 29, outputs of the plurality of photo-voltaic modules 102 are integrated, an output obtained by the integration is fed to a connection box 104, and a direct current output is fed to an inverter 105 from the connection box 104. The direct current output is converted into an alternating current in the inverter 105, and the alternating current is supplied to a home-use load 107 from a panel board 106. Further, power is also supplied from a commercial power system 108 to the home-use load 107. The power can be utilized from the power system 108 in a case where power supplied from the photo-voltaic apparatus is insufficient during the night, for example.

As described in the foregoing, the photo-voltaic apparatus generates a direct current output. In order to change the direct current output into an alternating current output, an independent inverter is required. Since this type of inverter has been conventionally developed for a household power supply, a system of several kilowatts is at the center thereof. Therefore, the power of the photo-voltaic module must be integrated depending on the capability of the inverter. In the conventional photo-voltaic apparatus, therefore, there are problems. For example, a minimum of approximately 6 m² is required as the light receiving area, and the location of the photo-voltaic apparatus is restricted.

Furthermore, a control circuit, a power circuit, and the like are respectively constructed as integrated circuits, and an inverter unit into which the integrated circuits are integrated is published. An alternating current output can be obtained from one photo-voltaic module by using the inverter unit.

The surface temperature of the photo-voltaic apparatus reaches not less than approximately 70° C. at the time of fine weather in midsummer, and its heat is transferred to the reverse surface of the photo-voltaic apparatus, so that the temperature of the reverse surface is also increased. When the inverter unit is directly located on the reverse surface of the photo-voltaic apparatus, therefore, the inverter unit is heated by heat generated by the photo-voltaic apparatus, which prevents heat from being self-radiated, resulting in reduced conversion efficiency. Further, the inverter unit may, in some cases, be broken by the heat generated by the photo-voltaic apparatus.

SUMMARY OF THE INVENTION

The present invention has been made in view of the above-mentioned conventional problems and has for its object to provide a photo-voltaic apparatus which is easily applicable to systems from one photo-voltaic module to a system of several kilowatts.

The present invention is directed to a photo-voltaic apparatus comprising a photo-voltaic module having a plurality of photo-voltaic cells and an inverter for converting a direct current output generated from the photo-voltaic cells into an alternating current and outputting the alternating current, which is characterized in that the inverter is mounted on a surface opposite to the light receiving surface of the photo-voltaic module with a clearance provided therebetween.

By the above-mentioned construction, the clearance is provided between the inverter and the surface opposite to the light receiving surface of the photo-voltaic module, that is, the reverse surface thereof, so that heat self-generated by the inverter can be efficiently radiated, and heat from the photo-voltaic module is not transferred to the inverter.

A terminal box for outputting power generated from the photo-voltaic cells is provided on a surface opposite to the light receiving surface of the photo-voltaic module, a first type connector is provided on the output side of the terminal box, and a second type connector engaged with the first type connector is provided in the inverter, so that the inverter can be supported on the photo-voltaic module by engagement of both the connectors.

By the above-mentioned construction, there can be provided a photo-voltaic apparatus in which it is possible to make electrical connection between the inverter and the photo-voltaic cells as well as support the inverter by coupling of both the connectors with good workability.

The inverter may be provided with a first type output connector.

Furthermore, the photo-voltaic module can be constituted by a photo-voltaic section having a plurality of photo-voltaic cells in its inner part and a frame for holding the photo-voltaic section, and the inverter can be mounted on a part of the frame.

The frame positioned outside of a position to which the inverter is mounted may be provided with a slit for air inflow.

By the above-mentioned construction, heat self-generated by the inverter is radiated by air in the slit, and the frame further functions as a heat radiating plate, so that better heat radiation is possible.

The present invention is characterized by comprising a plurality of photo-voltaic modules each having a plurality of photo-voltaic cells, and inverters each mounted on the photo-voltaic module and converting a direct current output generated from the photo-voltaic cells into an alternating current and outputting the alternating current, and in that the photo-voltaic modules are so located that their respective parts are overlapped with each other, and an air flow path for cooling the inverter is provided between the photo-voltaic modules.

Air is supplied to the inverter by providing the air flow path, so that heat self-generated by the inverter can be efficiently radiated.

Furthermore, the present invention is characterized in that the photo-voltaic module is constituted by a photo-voltaic section having a plurality of photo-voltaic cells in its inner part and a frame for holding the photo-voltaic section, the inverter is mounted on a frame in one of superimposed portions of the photo-voltaic module, a heat radiating fin in the inverter is arranged on the light receiving surface, and a containing section for containing the heat radiating fin of the other photo-voltaic module is provided in the other superimposed portion.

By the above-mentioned construction, heat self-generated by the inverter can be radiated more efficiently by the heat radiating fin.

A shading cover may be provided on the heat radiating fin.

The shading cover prevents the temperature of the inverter itself from being increased by solar radiation, so that good environmental temperatures are kept in the inverter.

Furthermore, in the present invention, a heat radiating fin for cooling the photo-voltaic module may be provided on a surface opposite to the light receiving surface of the photo-voltaic module.

The heat radiating fin can improve the heat radiation of the photo-voltaic module, and can prevent the temperature of the photo-voltaic module from being increased.

An inverter may be mounted on the heat radiating fin.

A planar section is formed on a surface, which is in contact with the inverter of the heat radiating fin, and an engaging section engaged with a part of the planar section is provided in the inverter. The inverter may be mounted by engagement between the engaging section and the planar section.

The inverter and the planar section of the heat radiating fin are brought into contact with each other, whereby heat from the inverter is satisfactorily transferred to the heat radiating fin, so that heat radiating properties of the inverter are improved. Further, if the inverter is mounted in the engaging section engaged with the planar section, the inverter can be easily mounted.

Furthermore, a connecting hole provided with an insulating bushing may be formed in the frame holding the photo-voltaic section, to make electrical connection between the photo-voltaic section and the inverter through the connecting hole.

Since the connecting hole is provided with the insulating bushing, insulating properties are kept good even if a conductive material such as aluminum is used for the frame.

The foregoing and other objects, features, aspects and advantages of the present invention will become more apparent from the following detailed description of the present invention when taken in conjunction with the accompanying drawings.

PREFERRED EMBODIMENTS OF THE PRESENT INVENTION

Figure 1:
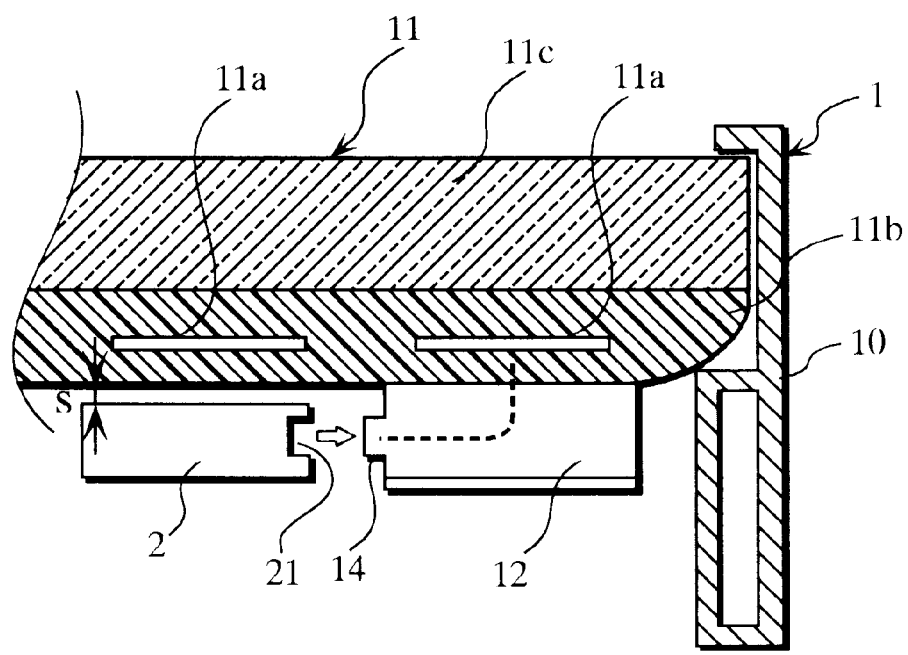
FIG. 1 is a cross-sectional view showing a principal part of a photo-voltaic apparatus according to a first embodiment of the present invention.
Figure 2:
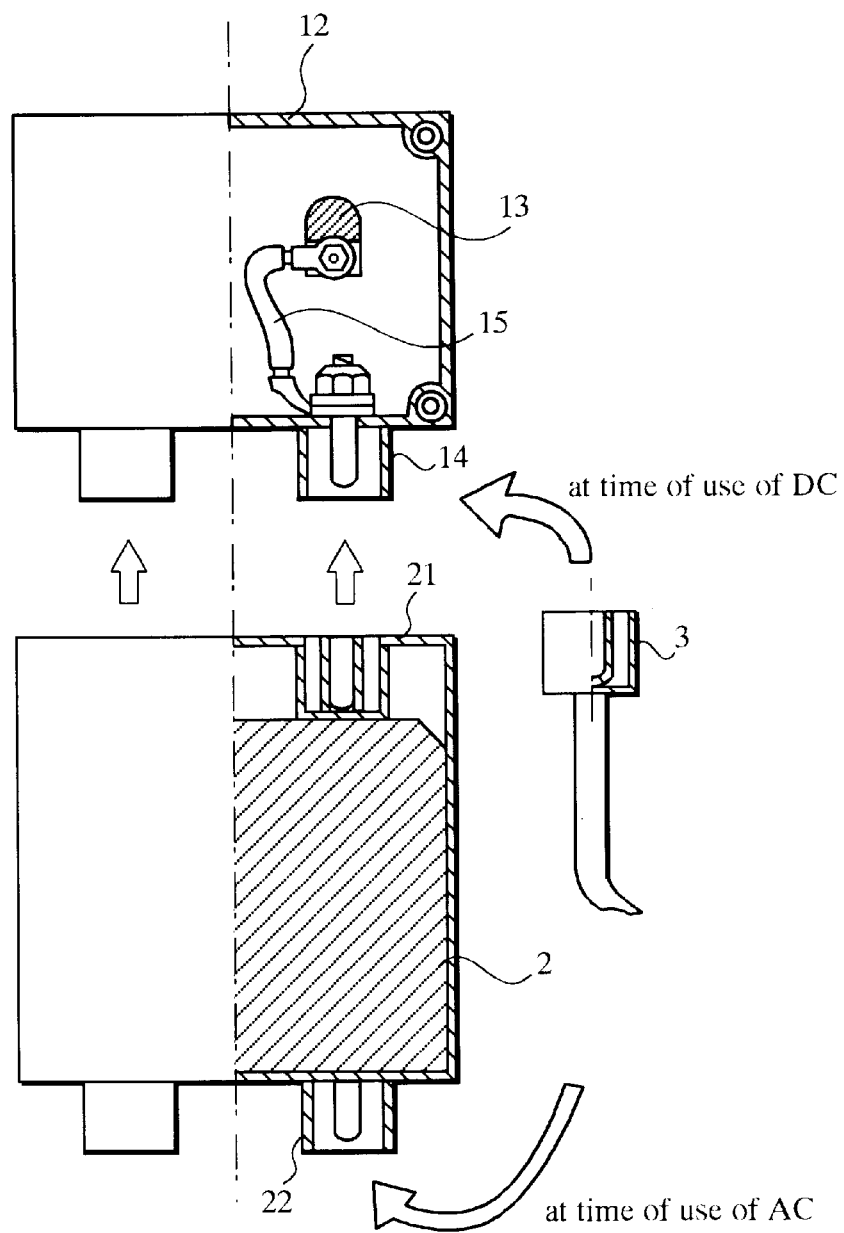
FIG. 2 is a plan view showing a principal part of the photo-voltaic apparatus according to the first embodiment of the present invention partially in cross section.

Description is now made of a first embodiment of the present invention in accordance with FIGS. 1 and 2. A photo-voltaic module 1 comprises a frame 10 made of aluminum, for example, and a photo-voltaic section 11, and is in a flat rectangular shape as a whole. The photo-voltaic section 11 is composed of tempered glass 11c or the like on the side of its light receiving surface, and has a plurality of photo-voltaic cells 11a in its inner part. The photo-voltaic cells 11a are coated with and protected by a resin layer 11b.

An output from the photo-voltaic module 1 is taken out from a terminal box 12 mounted on a surface opposite to the light receiving surface of the photo-voltaic section 11, that is, the reverse surface thereof. The terminal box 12 in the present embodiment is composed of insulating resin inferior in thermal conductivity such as ABS resin, and has a tub 13 connected to electrodes of the photo-voltaic cells and a male connector plug 14 in its inner part, as shown in FIG. 2. The tub 13 and the male connector plug 14 are connected to each other by a code 15.

On the other hand, a control circuit, a power circuit, and the like are respectively constructed as integrated circuits, and an inverter unit 2 into which the integrated circuits are integrated is mounted on each of photo-voltaic modules 1. A n output from the photo-voltaic module 1 is converted into an alternating current by the inverter unit 2, and the alternating current is outputted. The inverter unit 2 in the present embodiment comprises a female connector plug 21 connected to the male connector plug 14 of the terminal box 12. The female connector plug 21 is mounted on the male connector plug 14 of the terminal box 12, so that electrical connection between the photo-voltaic module 1 and the inverter unit 2 is made, and the inverter unit 2 is supported on the photo-voltaic module 1.

Consequently, it is possible to make electrical connection between the inverter unit 2 and the photo-voltaic section 11 as well as support the inverter unit 2 with good workability.

When the male connector plug 14 of the terminal box 12 and the female connector plug 21 of the inverter unit 2 are connected to each other, the shapes of the terminal box 12 and the connector plugs 14 and 21 and the positional relationship thereamong are so determined that a clearance s through which air sufficiently flows is provided between the inverter unit 2 and the reverse surface of the photo-voltaic section 11 of the photo-voltaic module 1.

The clearance s is provided between the inverter unit 2 and the reverse surface of the photo-voltaic section 11 of the photo-voltaic module 1 in order to efficiently radiate heat self-generated by the inverter unit 2 as well as not to transfer heat from the photo-voltaic section 11 to the inverter unit 2. Therefore, the terminal box 12 is composed of a material inferior in thermal conductivity so that the heat from the photo-voltaic section 11 is not transferred through the terminal box 12. Further, the terminal box 12 may be fixed to the photo-voltaic module 1 using a heat insulating material such as glass-wool in order to reduce heat conduction from the photo-voltaic section 11.

Furthermore, an output from the inverter unit 2 is generated from a male connector plug 22 provided in the inverter unit 2. The male connector plug 22 and the male connector plug 14 of the terminal box 12 use connector plugs in the same shape. When a plurality of photo-voltaic modules 1 are connected in parallel, the photo-voltaic modules 1 may be connected to each other using a cable with a connector 3.

By such construction, systems from one photo-voltaic module to a system of several kilowatts can be constructed by parallel connection between modules. Further, each of the photo-voltaic modules generates power depending on solar radiation, whereby system efficiency is prevented from being reduced by the effects of the direction and the shadow.

Furthermore, in the above-mentioned embodiment, when a direct current output is obtained as it is from the photo-voltaic module 1, the connector of the cable 3 may be connected to the connector plug 14 of the terminal box 12 after removing the inverter unit 2 from the terminal box 12.

Although in the above-mentioned embodiment, the photo-voltaic module 1 is constituted by the frame 10 and the photo-voltaic section 11, the photo-voltaic module 1 may be constructed upon omitting the frame 10 by directly forming photo-voltaic cells on a metal substrate, for example. It goes without saying that the present invention is similarly applicable to the photo-voltaic module 1 thus constructed.

Figure 3:
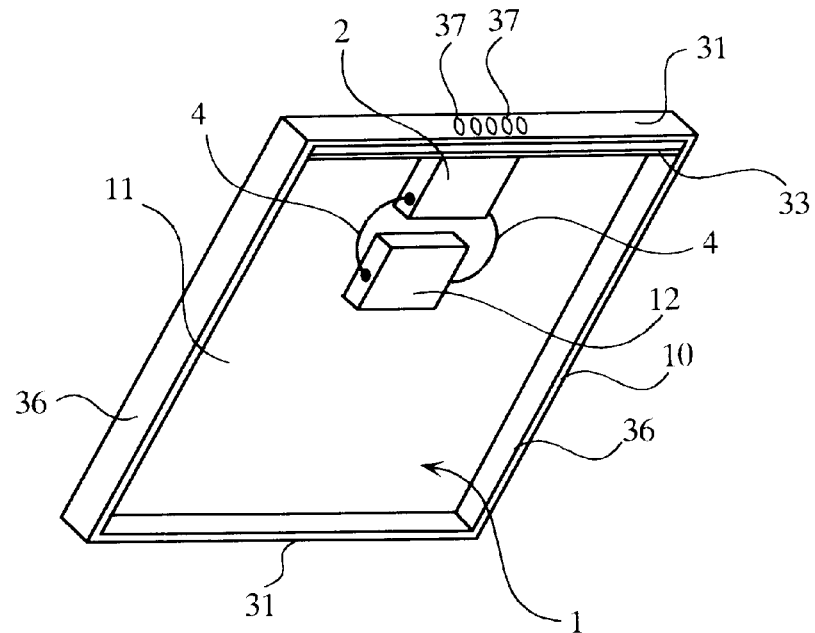
FIG. 3 is a perspective view showing a photo-voltaic apparatus according to a second embodiment of the present invention.
Figure 4:
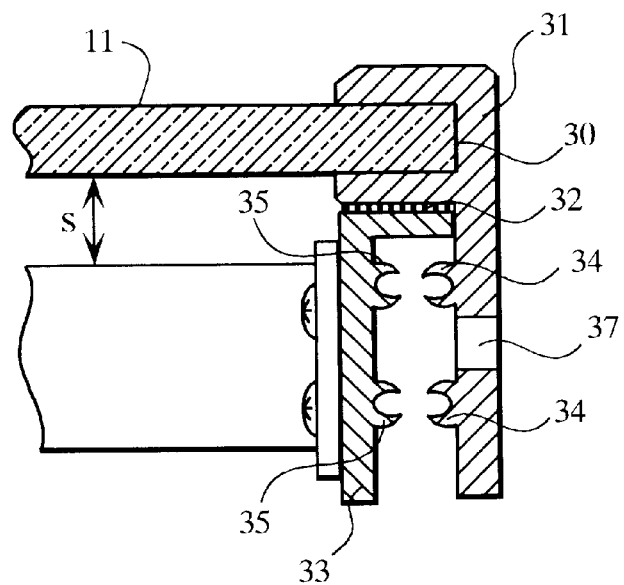
FIG. 4 is a cross-sectional view showing a principal part of the photo-voltaic apparatus according to the second embodiment of the present invention.
Figure 5:
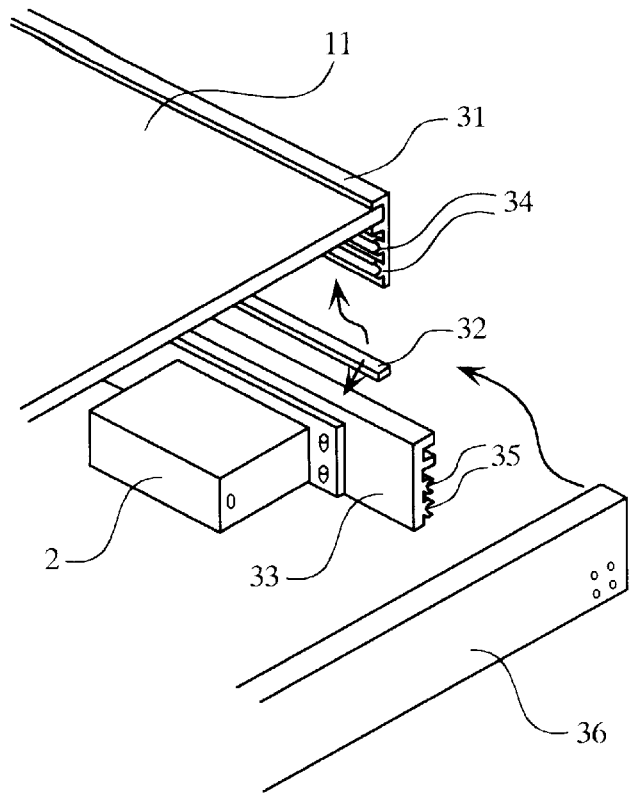
FIG. 5 is a perspective view showing a principal part of the photo-voltaic apparatus according to the second embodiment of the present invention.

Description is now made of a second embodiment of the present invention in accordance with FIGS. 3 to 5.

In the second embodiment, an inverter unit 2 is fixed to a part of a frame 10 so as to have a predetermined clearance s between the reverse surface of a photo-voltaic section 11 of a photo-voltaic module 1 and the inverter unit 2. That is, the frame 10 in the present embodiment comprises a pair of frames 31 having containing sections 30 with the photo-voltaic section 11 interposed therebetween, a frame 33 mounted on one of the frames 31 through a heat insulating material 32, and a pair of frames 36 mounted on female screw sections 34 and 35 provided in the frames 31 and 33 by screws, as shown in FIGS. 4 and 5. The frame 10 is formed by fixing each of the frames 36 to the frames 31 and 33 by screws to assemble the frames, and the photo-voltaic section 11 is fixed to the frames 31, 33 and 36.

In the present embodiment, the inverter unit 2 is fixed to the frame 33 by a screw, and the clearance s is provided between the inverter unit 2 and the reverse surface of the photo-voltaic section 11 when the frames 31, 33 and 36 are assembled. A terminal box 12 and the inverter unit 2 are connected to each other by a cable 4.

Furthermore, in the present embodiment, a slit for air inflow 37 is provided in the frame 31 to which the inverter unit 2 is fixed, so that air sufficiently flows into the frame 33.

Consequently, heat self-generated by the inverter unit 2 is radiated by air between the inverter unit 2 and the photo-voltaic section 11. Further, the frame 33 and the female screw section 35 also function as a heat radiating plate, so that good heat radiation is possible.

Figure 6:
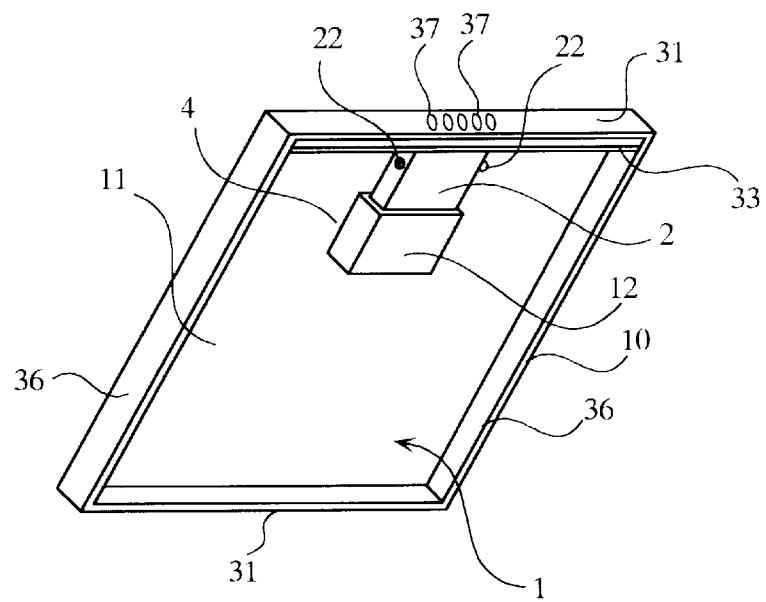
FIG. 6 is a perspective view showing a photo-voltaic apparatus according to a third embodiment of the present invention.
Figure 7:
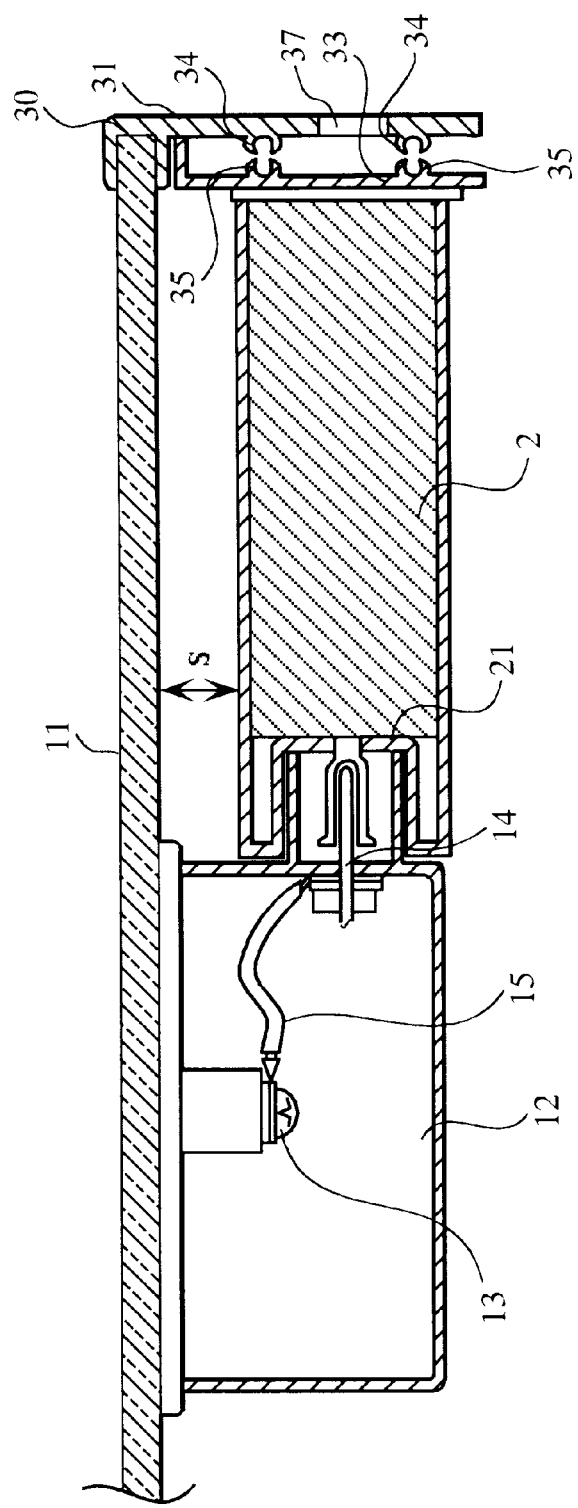
FIG. 7 is a cross-sectional view showing a principal part of the photo-voltaic apparatus according to the third embodiment of the present invention.
Figure 8:
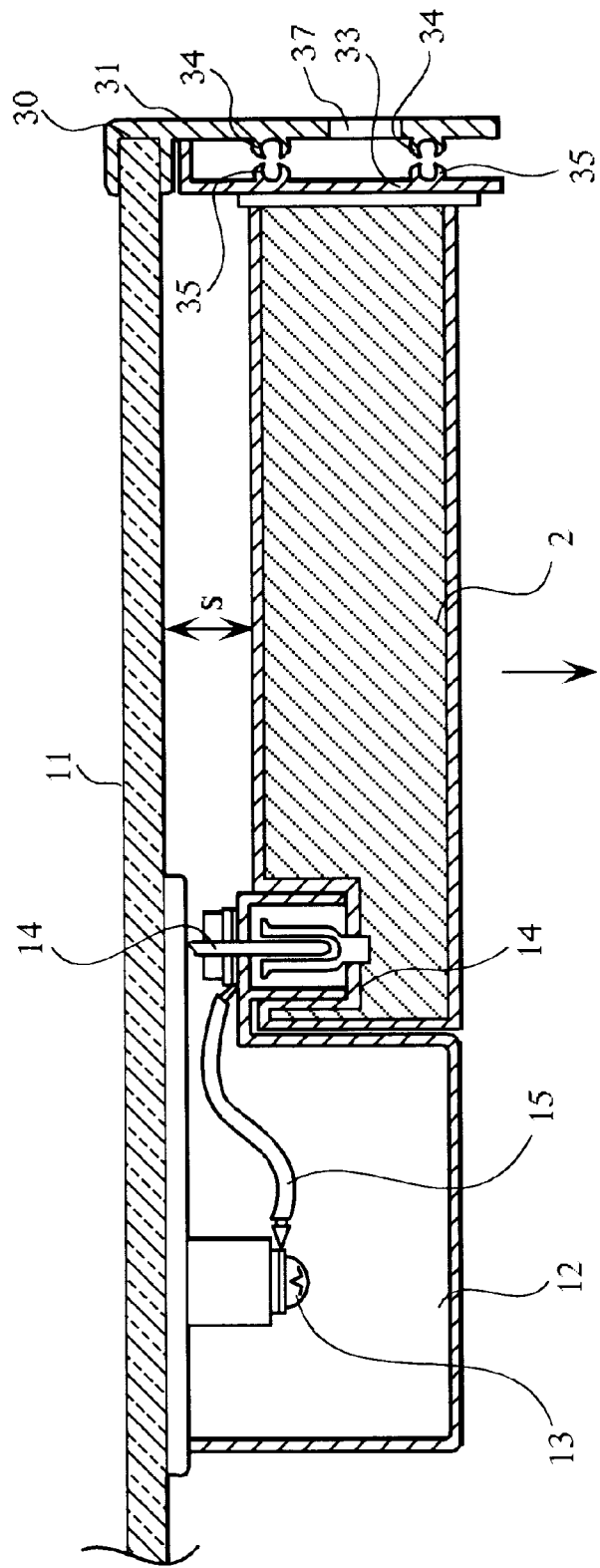
FIG. 8 is a cross-sectional view showing a principal part of the photo-voltaic apparatus according to the third embodiment of the present invention.

Description is now made of a third embodiment of the present invention in accordance with FIGS. 6 to 8. In the third embodiment shown in FIGS. 6 to 8, connection between an inverter unit 2 and a terminal box 12 in the second embodiment is directly made through a connector, as in the first embodiment.

In the embodiment shown in FIG. 7, the terminal box 12 is composed of insulating resin inferior in thermal conductivity such as ABS resin, and comprises a tub 13 connected to electrodes from photo-voltaic cells and a male connector plug 14 in its inner part, and the tub 13 and the male connector plug 14 are connected to each other by a code 15, as in the first embodiment. In the embodiment shown in FIG. 7, the male connector plug 14 is mounted in a direction parallel to a photo-voltaic section 11, that is, a direction perpendicular to a frame 33.

The inverter unit 2 in the present embodiment has a female connector plug 21 connected to the male connector plug 14 of the terminal box 12 on one side and is mounted on a frame 33 on the other side.

In mounting the inverter unit 2 and the terminal box 12, the inverter unit 2 is first fixed to the frame 33, after which the female connector plug 21 of the inverter unit 2 is mounted on the male connector plug 14 of the terminal box 12, to make electrical connection between the photo-voltaic section 11 and the inverter unit 2. The photo-voltaic section 11 is supported by a containing section 30 of a frame 31, after which each of the frames 31 and 33 and a frame 36 are screwed, to fix the frames 31, 33 and 36.

In the present embodiment, one end of the inverter unit 2 is supported by the thermal box 12, and the other end thereof is supported by the frame 33, whereby the inverter unit 2 can be more firmly supported.

In the embodiment shown in FIG. 7, the inverter unit 2 cannot be exchanged so long as the frame 33 and the frame 31 are not removed. On the other hand, in an embodiment shown in FIG. 8, an inverter unit 2, together with a frame 33, can be removed, so that the inverter unit 2 can be easily removed in cases such as a case where the inverter unit 2 develops a fault.

As shown in FIG. 8, in the present embodiment, a male connector 14 of a terminal box 12 and a female connector plug 21 of the inverter unit 2 are mounted in a direction perpendicular to a photo-voltaic section 11, that is, in a direction parallel to the frame 33.

In mounting the inverter unit 2 and the terminal box 12, the inverter unit 2 is first fixed to the frame 33, after which the female connector plug 21 of the inverter unit 2 is mounted on the male connector plug 14 of the terminal box 12, to make electrical connection between the photo-voltaic section 11 and the inverter unit 2. The photo-voltaic section 11 is supported by a containing section 30 of a frame 31, after which each of the frames 31 and 33 and a frame 36 are screwed, to fix the frames 31, 33 and 36.

When the inverter unit 2 is removed, only a screw for mounting the frames 33 and 36 is removed in a state where the frame 31 and the frame 36 are fixed. The inverter unit 2, together with the frame 33, is removed by pulling the inverter unit 2, together with the frame 33, in a direction indicated by an arrow in FIG. 8.

Also in the above-mentioned embodiments, when the connector plug 14 of the terminal box 12 and the connector plug 21 of the inverter unit 2 are connected to each other, the shapes of the terminal box 12 and the respective connector plugs 14 and 21 and the positional relationship thereamong are so determined that a clearance s through which air sufficiently flows is provided between the inverter unit 2 and the reverse surface of the photo-voltaic section 11.

A fourth embodiment of the present invention will be described in accordance with FIG. 9.

Figure 9:
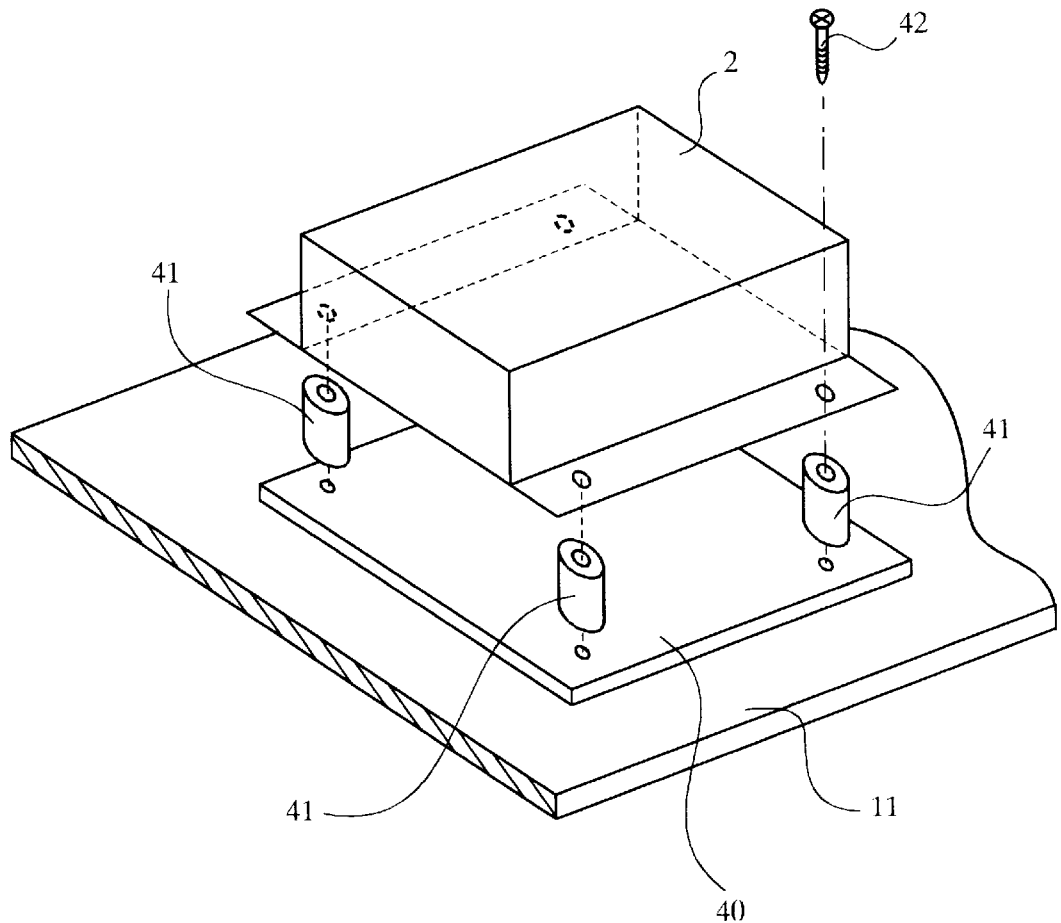
FIG. 9 is a perspective view showing a principal part of a photo-voltaic apparatus according to a fourth embodiment of the present invention.

In the embodiment shown in FIG. 9, an inverter unit 2 is mounted on the reverse surface of a photo-voltaic section 11 of a photo-voltaic module 1 through legs 41 so that a predetermined clearance s is provided between the reverse surface of the photo-voltaic section 11 and the inverter unit 2. A predetermined clearance corresponding to the height of the legs 41 is formed between the reverse surface of the photo-voltaic section 11 and the inverter unit 2. In the present embodiment, a heat insulating plate 40 made of Bakelite or the like is mounted on the reverse surface of the photo-voltaic section 11 with adhesives or the like in order to prevent the conduction of heat from the photo-voltaic section 11, the legs 41 similarly formed of a heat insulating material are placed thereon, and the inverter unit 2 and the legs 41 are mounted on the heat insulating plate 40 by screws 42. The inverter unit 2 is thus mounted on the reverse surface of the photo-voltaic section 11 through the heat insulating plate 40 and the legs 41, whereby a predetermined clearance is formed between the inverter unit 2 and the photo-voltaic section 11. Air sufficiently flows into the inverter unit 2 by the clearance, whereby heat self-generated by the inverter unit 2 can be efficiently radiated. Heat from the photo-voltaic section 11 can be prevented from being conducted to the inverter unit 2. Further, electrical connection between the photo-voltaic section 11 and the inverter unit 2 is made by connecting a cable to a terminal box (not shown).

Figure 10:
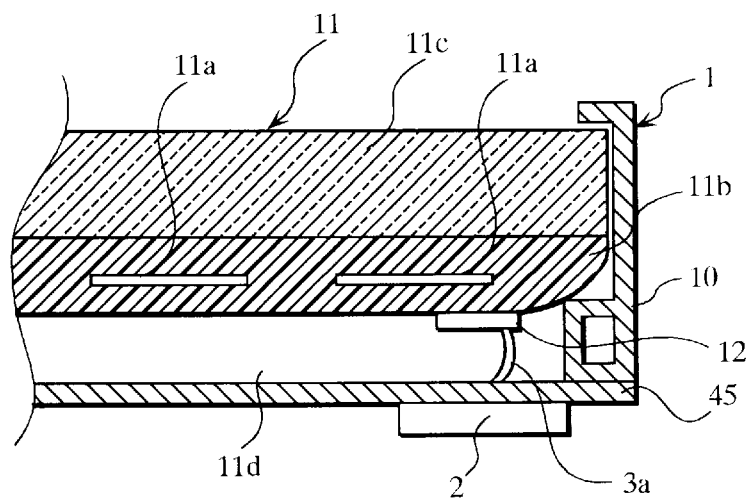
FIG. 10 is a cross-sectional view showing a principal part of a photo-voltaic apparatus according to a fifth embodiment of the present invention.

Description is now made of a fifth embodiment of the present invention in accordance with FIG. 10.

In the embodiment shown in FIG. 10, a heat insulating plate 45 made of Bakelite or the like of such size as to cover the entire reverse surface of a photo-voltaic section 11 of a photo-voltaic module 1 is mounted on a surface, opposite to the light receiving surface of the photo-voltaic section 11, of a frame 10 by adhesives, screws or the like. An inverter unit 2 is fixed on a surface, opposite to the surface of the photo-voltaic section 11, of the heat insulating plate 45 by screws or the like. A terminal box 12 and the inverter unit 2 are connected to each other by a cable 3a. An air flow layer lid of a clearance through which air sufficiently flows is provided between the reverse surface of the photo-voltaic section 11 and the heat insulating plate 45, whereby heat from the photo-voltaic section 11 is radiated by the air flow layer 11d. Heat can be prevented from being transferred toward the inverter unit 2 from the photo-voltaic section 11 by the heat insulating plate 45.

Furthermore, heat self-generated by the inverter unit 2 can be sufficiently radiated on the surface of the inverter unit 2. In order to further improve the heat radiating effect, a heat radiating fin or the like may be provided on the surface of the inverter unit 2.

Figure 11:
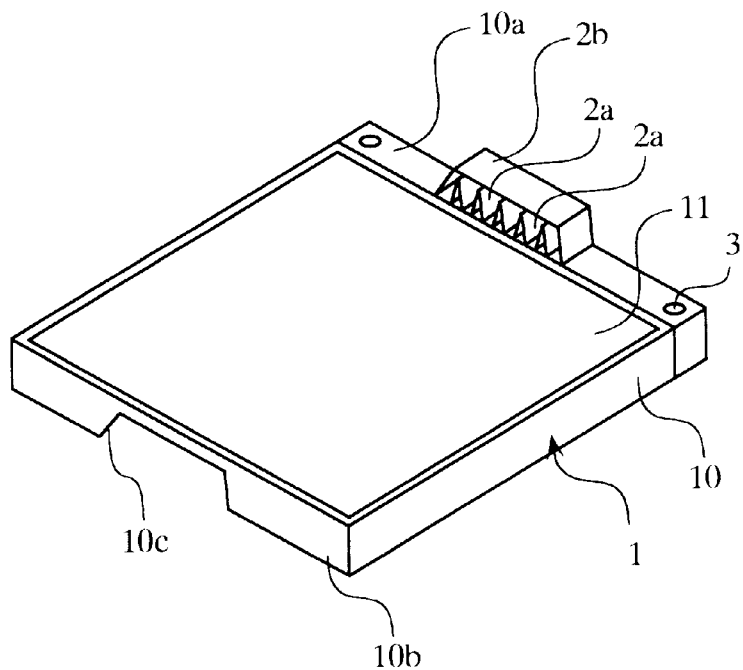
FIG. 11 is a perspective view showing a photo-voltaic module of a photo-voltaic apparatus according to a sixth embodiment of the present invention.
Figure 12:
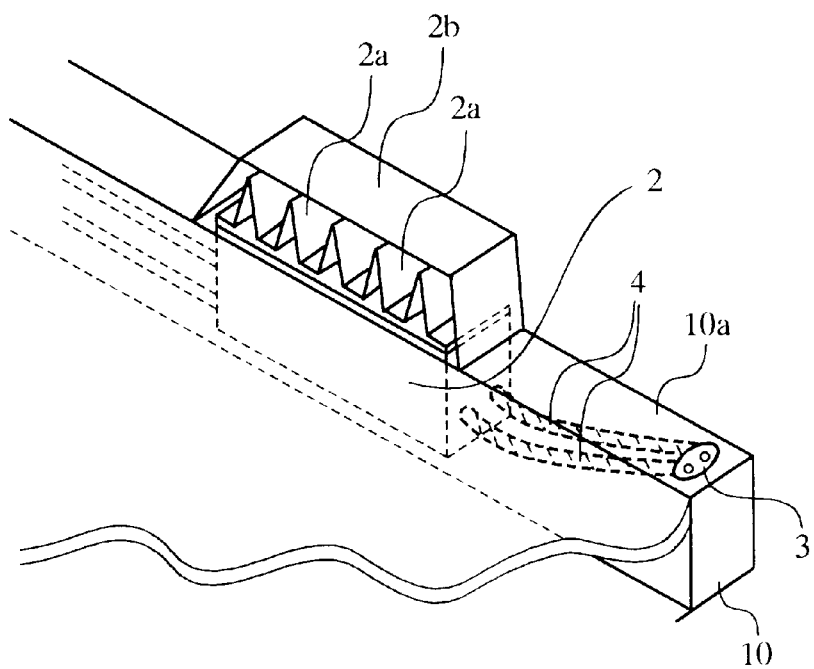
FIG. 12 is a perspective view showing a principal part of the photo-voltaic apparatus according to the sixth embodiment of the present invention.
Figure 13:
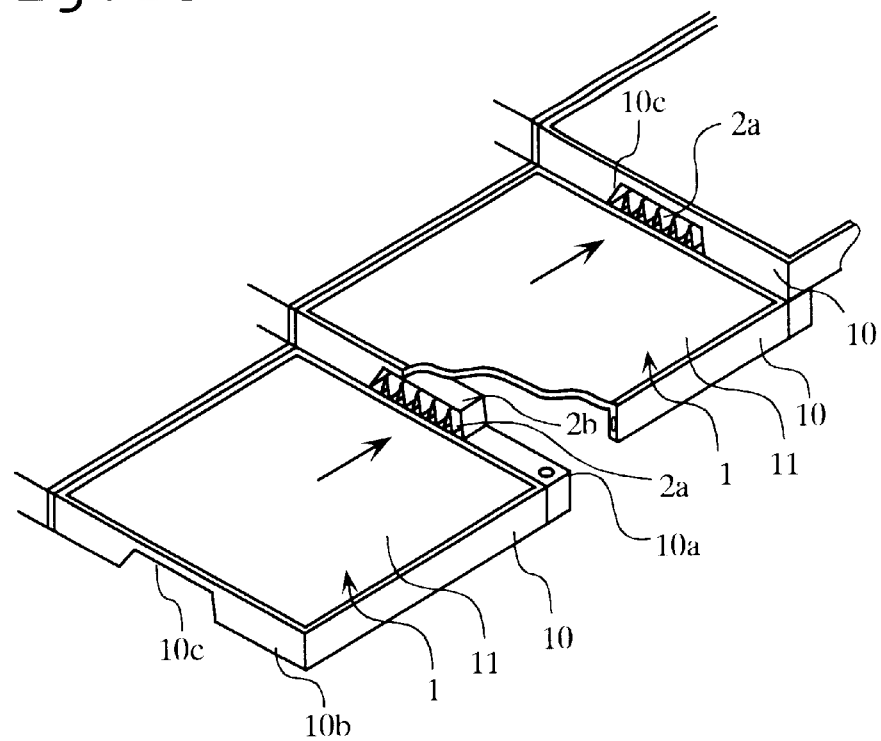
FIG. 13 is a perspective view showing the photo-voltaic apparatus according to the sixth embodiment of the present invention.

Description is made of a sixth embodiment of the present invention in accordance with FIGS. 11 to 13. A photo-voltaic module 1 comprises a frame 10 made of aluminum, for example, and a photo-voltaic section 11, and is in a flat rectangular shape as a whole. The photo-voltaic section 11 is composed of tempered glass or the like on the side of its light receiving surface, and has a plurality of photo-voltaic cells in its inner part. The photo-voltaic cells are coated with and protected by a resin layer.

An output from the photo-voltaic module 1 is taken out from a terminal box (not shown) mounted on a surface opposite to the light receiving surface of the photo-voltaic section 11, that is, the reverse surface thereof.

On the other hand, a control circuit, a power circuit, and the like are constructed as integrated circuits, an inverter unit 2 into which the integrated circuits are integrated is mounted on each of photo-voltaic modules 1. An output from the photo-voltaic module 1 is converted into an alternating current by the inverter unit 2, and the alternating current is outputted. The inverter unit 2 in the present embodiment is contained in and mounted on a frame 10a at one end of the frame 10 whose part is superimposed when the photo-voltaic modules 1 are located. A cable from the terminal box is connected to the inverter unit 2, to make electrical connection between the photo-voltaic section 11 and the inverter unit 2.

An output connector 3 is provided on the light receiving surface of the frame 10a, and the connector 3 and the inverter unit 2 are electrically connected to each other by a cable 4.

Furthermore, a heat radiating fin 2a of the inverter unit 2 is so provided as to be projected toward the light receiving surface of the frame 10a. In the present embodiment, the heat radiating fin 2a of the inverter unit 2 is provided on the light receiving surface. When solar light is directly irradiated onto the heat radiating fin 2a, therefore, the temperature of the heat radiating fin 2a is increased, which may lose the heat radiating effect of the inverter unit 2. Therefore, a shading cover 2b made of aluminum is provided.

Furthermore, a containing section 10c containing the heat radiating fin 2a and the shading cover 2b is formed in a frame 10b at the other end of the frame 10.

As shown in FIG. 13, when the photo-voltaic modules 1 are so located that their respective parts are overlapped with each other, the heat radiating fin 2a and the shading cover 2b are contained in the containing section 10c. When the photo-voltaic modules 1 are thus located one other the other, a space between the heat radiating fin 2a and the reverse surface of the photo-voltaic module 1 located thereon functions as an air flow path to the inverter unit 2, and heat self-generated by the inverter unit 2 is efficiently radiated by air from the heat radiating fin 2a and the air flow path, so that the inverter unit 2 can be maintained at good environmental temperatures.

Although in the above-mentioned embedment, the heat radiating fin 2a is covered with the shading cover 2b, the shading cover 2b can be omitted by providing a shading portion on the side of the light receiving surface of the containing section 10c.

Furthermore, in the above-mentioned embodiment, when the plurality of photo-voltaic modules 1 are connected to each other in parallel, the photo-voltaic modules may be connected to each other using a cable.

By such construction, systems from one photo-voltaic module to a system of several kilowatts can be constructed by parallel connection between modules. Further, each of the photo-voltaic modules generates power depending on solar radiation, whereby system efficiency can be prevented from being reduced by the effects of the direction and the shadow. Further, the inverter unit 2 can efficiently radiate heat by air supplied from the heat radiating fin 2a and the air flow path.

Figure 14:
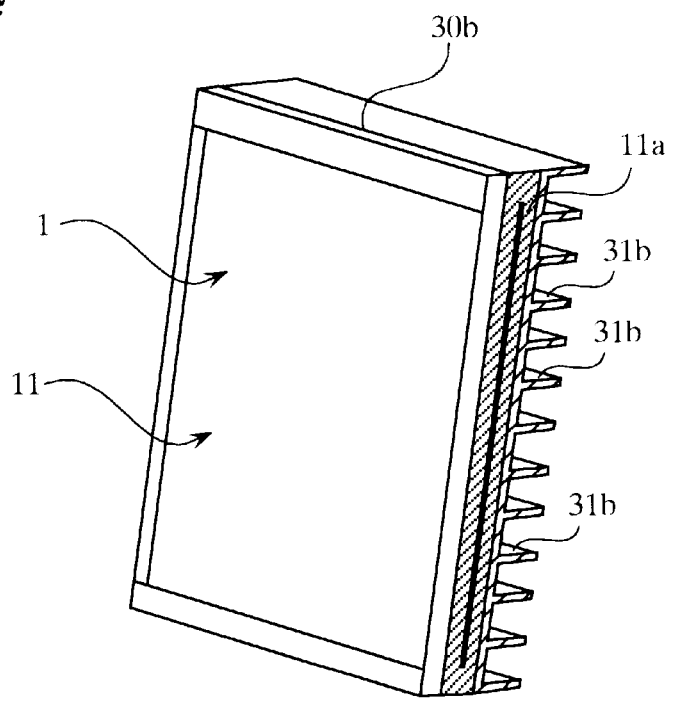
FIG. 14 is a perspective view showing a photo-voltaic module of a photo-voltaic apparatus according to a seventh embodiment of the present invention.
Figure 15:
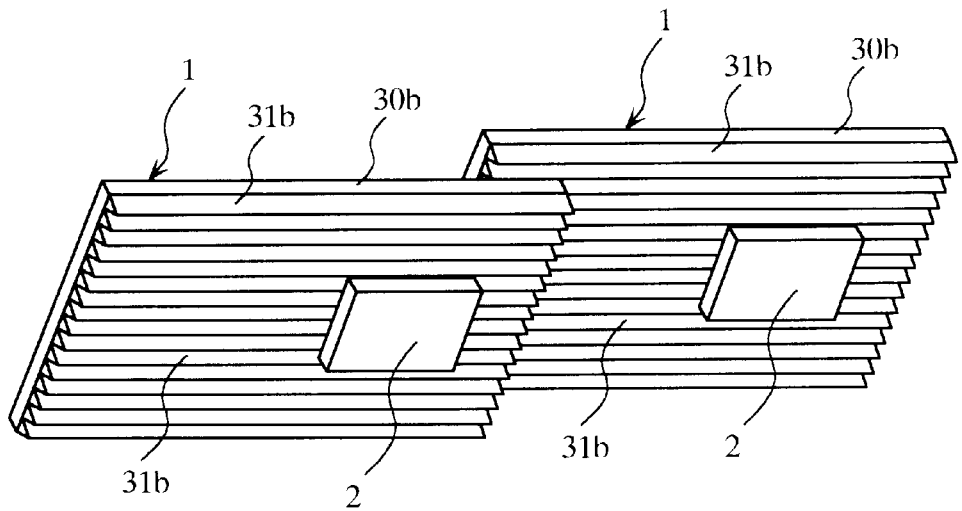
FIG. 15 is a perspective view showing a principal part of the photo-voltaic apparatus according to the seventh embodiment of the present invention.
Figure 16:
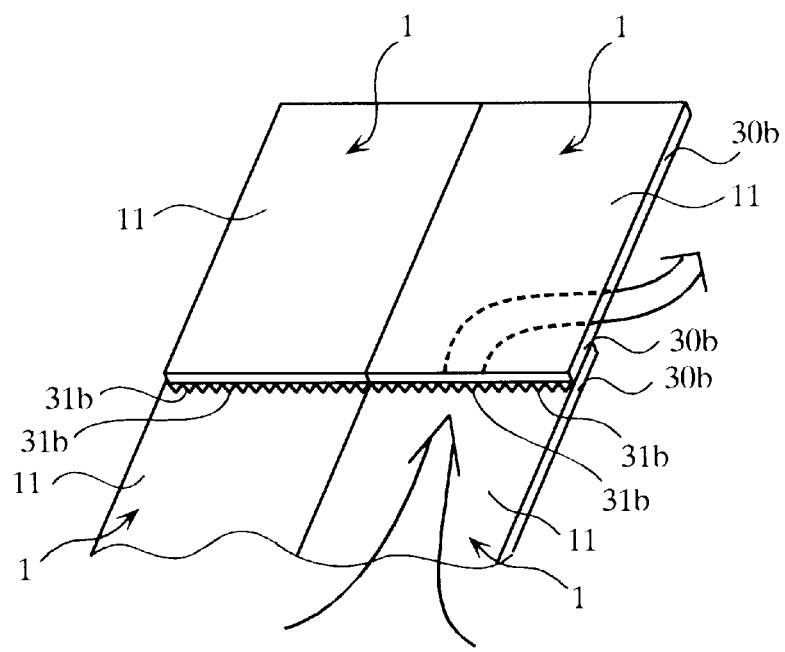
FIG. 16 is a perspective view showing the photo-voltaic apparatus according to the seventh embodiment of the present invention.

Description is now made of a seventh embedment of the present invention in accordance with FIGS. 14 to 16.

A photo-voltaic module 1 in the seventh embodiment holds a photo-voltaic section 11 in a frame 30b made of an aluminum extruded forming material. A heat radiating fin 31b for improving heat radiation of the photo-voltaic module 1 is provided on a surface opposite to the light receiving surface of the frame 30b. The photo-voltaic module 1 is formed by laminating photo-voltaic cells and tempered glass through transparent adhesives on the frame 30b and sealing the periphery thereof.

In the present embodiment, an inverter unit 2 is fixed so as to come into contact with the heat radiating fin 31b. As shown in FIGS. 15 and 16, the photo-voltaic modules 1 are so located that their respective parts are overlapped with each other by putting the heat radiating fin 31b of the photo-voltaic module 1 on the photo-voltaic section 11 of the other photo-voltaic module 1. When the photo-voltaic modules are thus located, an air flow path as indicated by an arrow in FIG. 16 is formed between the heat radiating fin 31b and the light receiving surface of the photo-voltaic module 1 located thereunder, so that air is supplied to the inverter unit 2, and heat self-generated by the inverter unit 2 can be efficiently radiated. Therefore, the inverter unit 2 can be maintained at good environmental temperatures.

Although in the above-mentioned embodiment, the photo-voltaic module 1 is so constructed as to hold the photo-voltaic section 11 in the frame 30b composed of an aluminum extruded forming material, the photo-voltaic module 1 may be constructed upon omitting the frame by directly forming photo-voltaic cells on a metal substrate provided with the heat radiating fin 31b, for example. It goes without saying that the present invention is also applicable to the photo-voltaic module 1 thus constructed.

Figure 17:
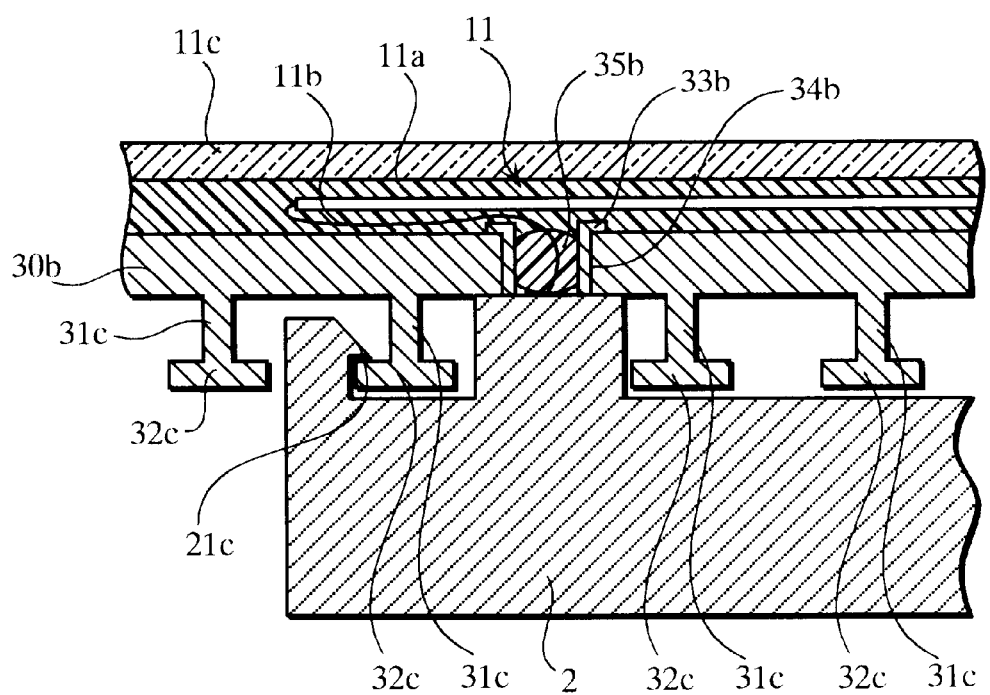
FIG. 17 is a cross-sectional view showing a principal part of a photo-voltaic apparatus according to an eighth embodiment of the present invention.

In an eighth embodiment of the present invention shown in FIG. 17, a leading end 32c of a heat radiating fin 31c is formed in a planar shape, and an inverter unit 2 is so mounted as to adhere to the leading end 32c. The inverter unit 2 is provided with an engaging claw 21c engaged with the leading end 32c of the heat radiating fin 31c. The inverter unit 2 and the heat radiating fin 31c are mounted by engaging the engaging claw 21c with a part of the leading end 32c of the heat radiating fin 31c.

Furthermore, electrical connection between a photo-voltaic section 11 and the inverter unit 2 is made by connecting a lead wire 11b formed of copper foil or the like of a photo-voltaic cell 11a to a terminal of the inverter unit 2 through a connecting hole 34b of a frame 30b. In the present embodiment, in order to reliably insulate the lead wire 11b and the frame 30b from each other, an insulating bushing 33b is mounted on the connecting hole 34b, and the lead wire 11b is passed through the connecting hole 34b, after which the connecting hole 34b is filled with resin 35b.

The inverter unit 2 and the planar leading end 32c of the heat radiating fin 31c are thus brought into contact with each other, whereby heat from the inverter unit 2 is satisfactorily transferred to the heat radiating fin 31c, resulting in improved heat radiating properties of the inverter unit 2. Further, the inverter unit 2 is mounted by the engaging claw 21c engaged with the leading end 32c, whereby the inverter unit 2 can be easily mounted.

Description is now made of a ninth embodiment of the present invention in accordance with FIGS. 18 to 25.

Figure 18:
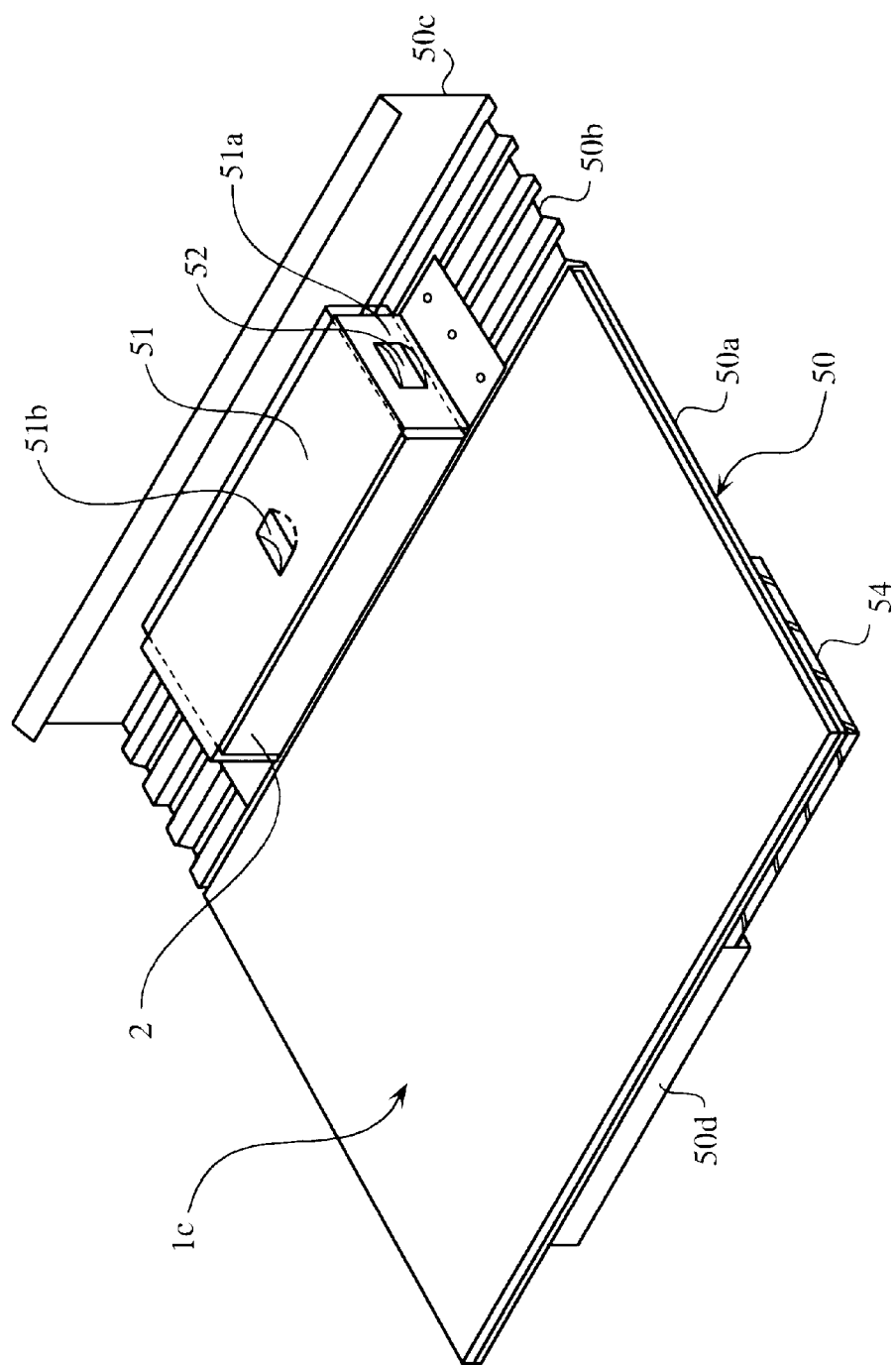
FIG. 18 is a perspective view showing a principal part of a photo-voltaic apparatus according to a ninth embodiment of the present invention.
Figure 19:
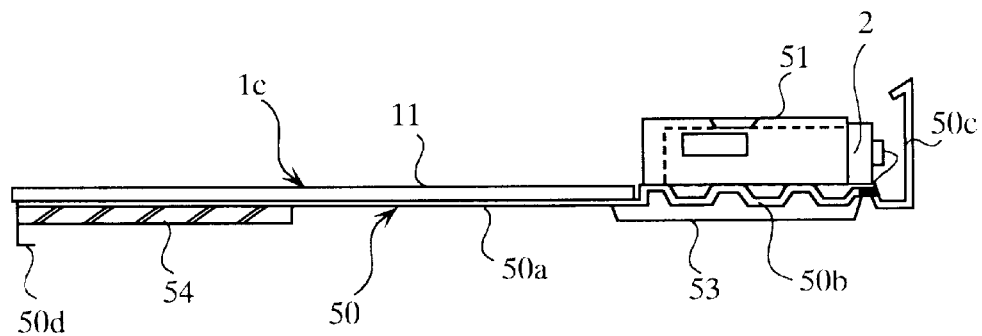
FIG. 19 is a cross-sectional view showing a principal part of the photo-voltaic apparatus according to the ninth embodiment of the present invention.
Figure 20:
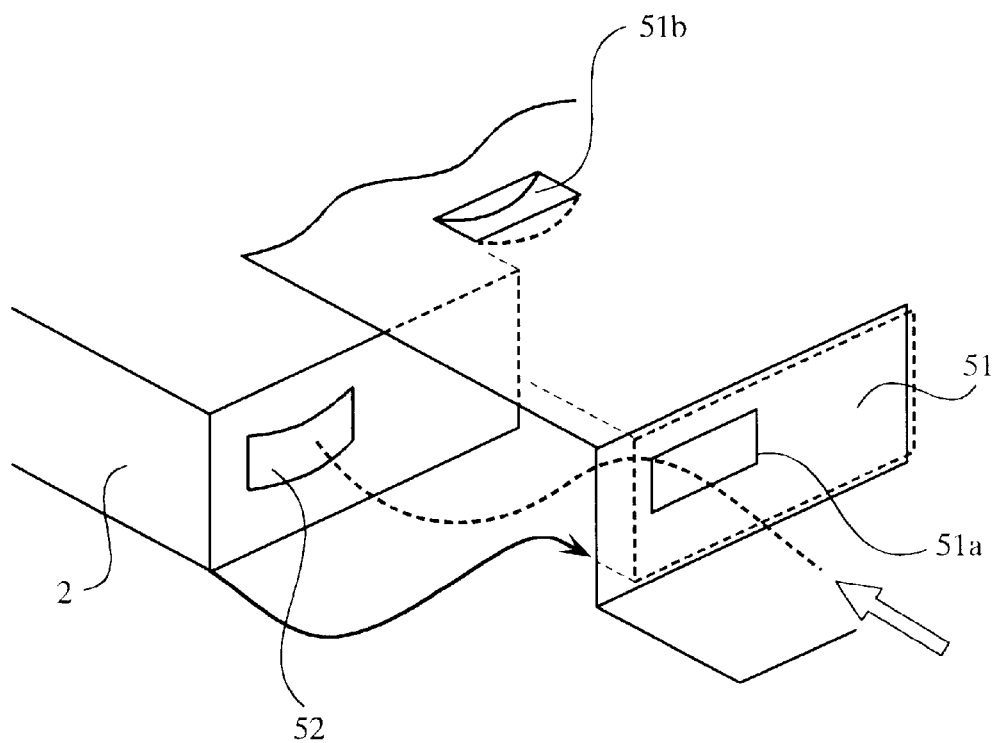
FIG. 20 is a perspective view showing a state where an inverter unit is mounted in the ninth embodiment of the present invention.

A photo-voltaic module 1c shown in FIG. 18 is a building material type photo-voltaic apparatus used as a roof material directly installed on a roof board of a roof.

The photo-voltaic module 1c has a plurality of photo-voltaic cells in its inner part, and comprises a photo-voltaic section 11 composed of tempered glass or the like on the side of its light receiving surface and a slate plate section 50 formed of an iron plate fixed to the reverse surface of the photo-voltaic section 11 with adhesives or the like. The slate plate section 50 comprises a base plate section 50a covering the entire reverse surface of the photo-voltaic section 11 and a superimposed section 50b extending toward the top of the roof from the base plate section 50a. When the photo-voltaic module 1 is located on th e roof, the superimposed section 50b is superimposed on the reverse surface of the other photo-voltaic module 1, so that their respective parts of the photo-voltaic modules 1 are overlapped with each other.

In the present embodiment, the superimposed section 50b is provided with projections and recesses by press working or the like in order to abate the force of the rain. A flashing section 50c folded upward is provided in an end of the superimposed section 50b. The projections and recesses can not only abate the force of the rain but also reduce the conduction of heat from the slate plate section 50 to the inverter unit 2 put thereon.

A control circuit, a power circuit, and the like are respectively constructed as integrated circuits, and an inverter unit 2 into which the integrated circuits are integrated is mounted on the superimposed section 50b of each of the photo-voltaic modules 1. An output from the photo-voltaic module 1 is converted into an alternating current by the inverter unit 2, and the alternating current is outputted.

In the present embodiment, in order to simplify the fixing of the inverter unit 2, a hat type unit fitting 51 is mounted on the superimposed section 50b by spot welding or the like. An engaging hole 51a engaged with a fixing spring member 52 provided in the inverter unit 2 and a spring mechanism 51b formed by press working for pressing the inverter unit 2 contained in the fitting 51 toward the superimposed section 50b are provided on side surfaces of the unit fitting 51.

The inverter unit 2 can be easily mounted by slipping the inverter unit 2 into the unit fitting 51 from the photo-voltaic section 11 and engaging the fixing spring material 52 provided in the inverter unit 2 with the engaging hole 51a of the unit fitting 51. In a case where the inverter unit 2 must be removed in the case of maintenance and checking, when the fixing spring material 52 is pressed in a direction indicated by an arrow in FIG. 20, and the inverter unit 2 is pulled toward the photo-voltaic section 11, the inverter unit 2 can be easily removed. Electrical connection between the photo-voltaic section 11 and the inverter unit 2 can be made by connecting a lead wire 53 from the photo-voltaic section 11 to the inverter unit 2.

Furthermore, the base plate section 50a is provided with a heat insulating plate 54 so that heat from the photo-voltaic section 11 is not transferred to the inverter unit 2. When the photo-voltaic module 1 is located with a clearance provided between the photo-voltaic section 11 and the inverter unit 2, the heat insulating plate 54 may be omitted.

Furthermore, the lower end of the base plate section 50a is provided with an L-shaped engaging member 50d engaged with a part of the fitting 51 of the photo-voltaic module 1 located thereunder.

Figure 21:
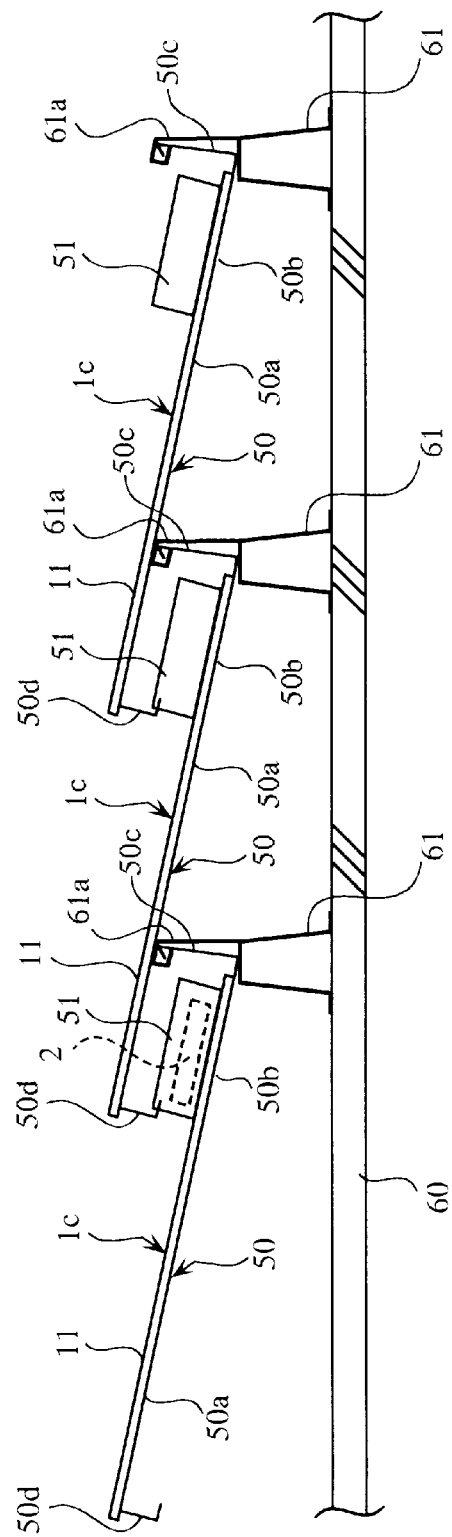
FIG. 21 is a side view showing a state where the photo-voltaic apparatus according to the ninth embodiment of the present invention is mounted on a roof.

In mounting the photo-voltaic module 1 on a roof, a vertical bridge fitting 61 is fixed on a roof board 60 of the roof by nails or the like, as shown in FIG. 21. A folding fitting 61a engaged with a folded portion at the leading end of a flashing fitting 50c is provided at the leading end of the vertical bridge fitting 61. A superimposed section 50b of a slate plate section 50 in the photo-voltaic module 1 is put on the vertical bridge fitting 61, to engage the folding fitting 61a of the vertical bridge fitting 61 and the flashing fitting 50c with each other. The photo-voltaic module 1 is rigidly fixed in the downward direction (the direction of dropping weight) by the engagement. The photo-voltaic module 1 is so arranged that a part of the base plate section 50a of the photo-voltaic module 1 is superimposed on the superimposed section 50b of the photo-voltaic module 1, and is fixed by engaging a part of the fitting 51 and an engaging member 50d. The photo-voltaic module 1 is thus fixed by engaging a part of the fitting 51 and the engaging member 50d, so that the photo-voltaic module 1 can be prevented from being flapped by air blowing upward from below the roof.

Furthermore, the photo-voltaic modules 1 are so located that their respective parts are overlapped with each other by putting the base plate section 50a of the photo-voltaic module 1 on the photo-voltaic section 11 of the other photo-voltaic module 1. If the photo-voltaic modules 1 are thus located, an air flow path is formed between the top of the inverter unit 2 and the light receiving surface of the base plate section 50a of the photo-voltaic module 1, so that air is supplied to the inverter unit 2, and heat self-generated by the inverter unit 2 can be efficiently radiated. Therefore, the inverter unit 2 can be maintained at good environmental temperatures.

Figure 22:
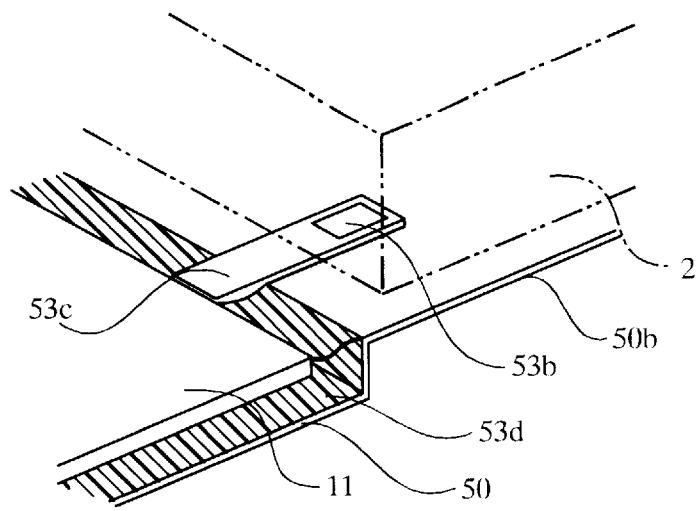
FIG. 22 is a perspective view showing electrical connection between an inverter unit and a photo-voltaic section in the ninth embodiment of the present invention.
Figure 23:
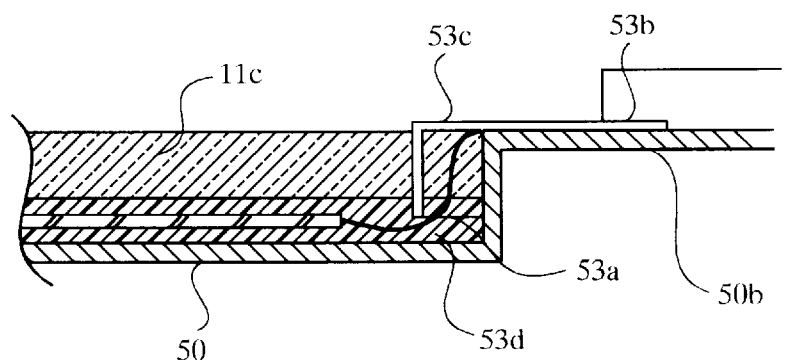
FIG. 23 is a cross-sectional view showing electrical connection between the inverter unit and the photo-voltaic section in the ninth embodiment of the present invention.

FIGS. 22 and 23 show an embodiment in which electrical connection between a photo-voltaic section 11 of a photo-voltaic module 1 and an inverter unit 2 is made easy. An output tub 53b connected to the inverter unit 2 is fixed on a superimposed section 50b, and the output tub 53b and the photo-voltaic section 11 are connected to each other by a lead wire 53a. The output tub 53b and the superimposed section 50b are electrically insulated from each other. Further, the output tub 53b is covered with a tub cover 53c, and the tub cover 53c is fixed by EVA resin 53d. An input tub (not shown) in contact with the output tub 53a is provided in the lower part of the inverter unit 2. The output tub 53b and the input tub are brought into contact with each other by inserting the inverter unit 2 into a fitting 51, whereby electrical connection therebetween can be made.

Figure 24:
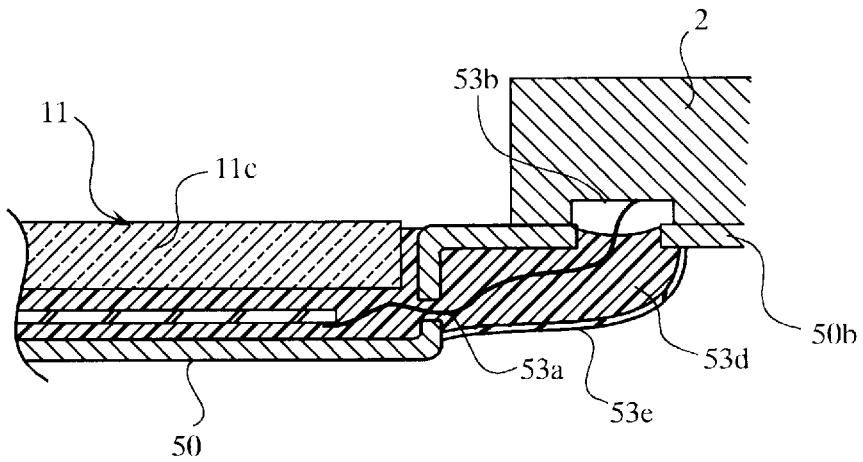
FIG. 24 is a cross-sectional view showing electrical connection between the inverter unit and the photo-voltaic section in the ninth embodiment of the present invention.

In an embodiment shown in FIG. 24, a slate plate section 50 is provided with a hole, an output tub 53b is fixed to a superimposed section 50b. Elements of a photo-voltaic section 11 and the output tub 53b are connected to each other by a cable through the hole, are fixed to each other by EVA resin, and are further coated with a cover film 53e.

Figure 25:
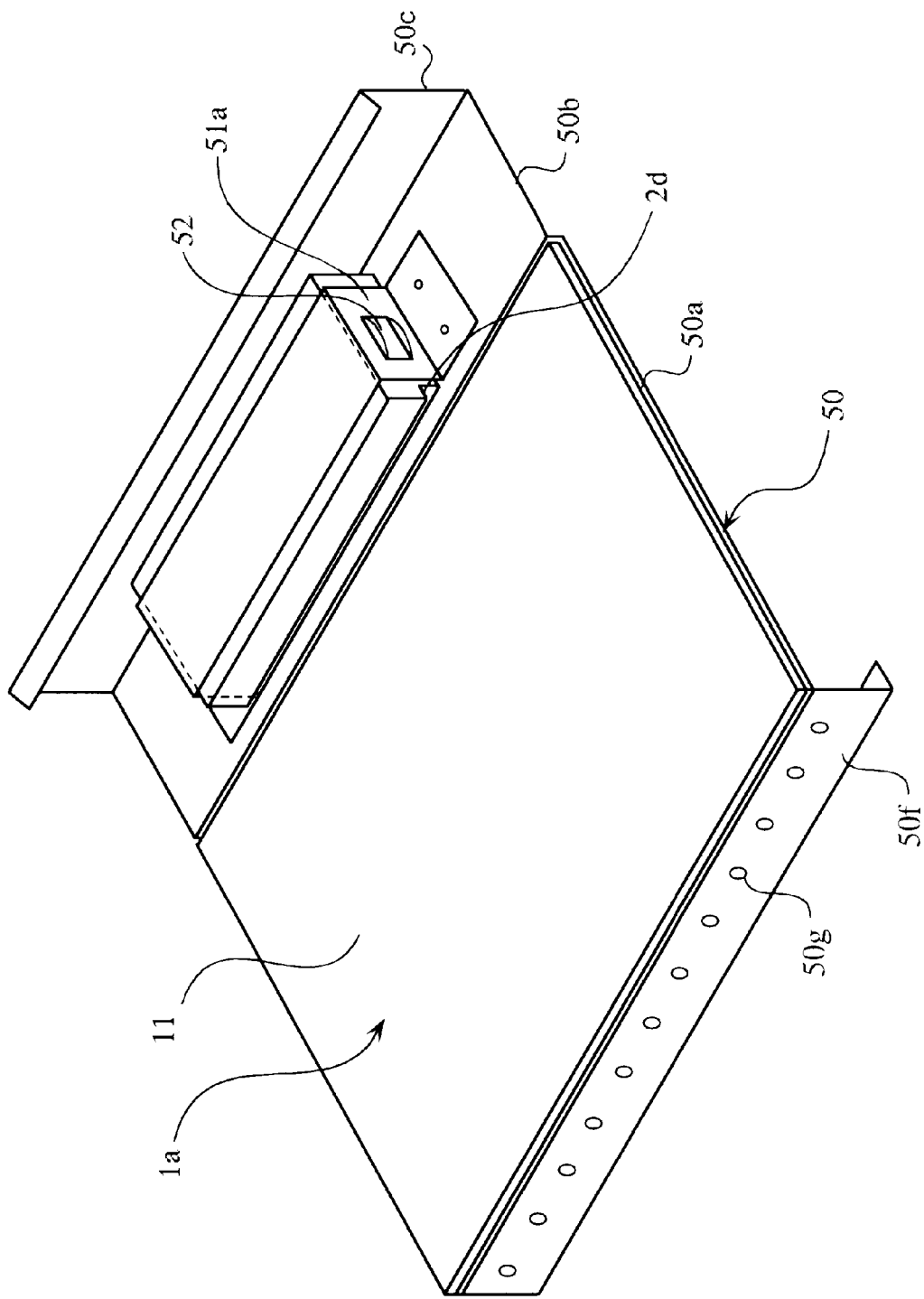
FIG. 25 is a perspective view showing a principal part of the photo-voltaic apparatus according to the ninth embodiment of the present embodiment.

In an embodiment shown in FIG. 25, a notch 2d is formed in an inverter unit 2, and the notch 2d and an engaging member 50f are engaged with each other. The engaging member 50f is provided with a lot of holes 50g so that air sufficiently passes through the inverter unit 2.

Figure 26:
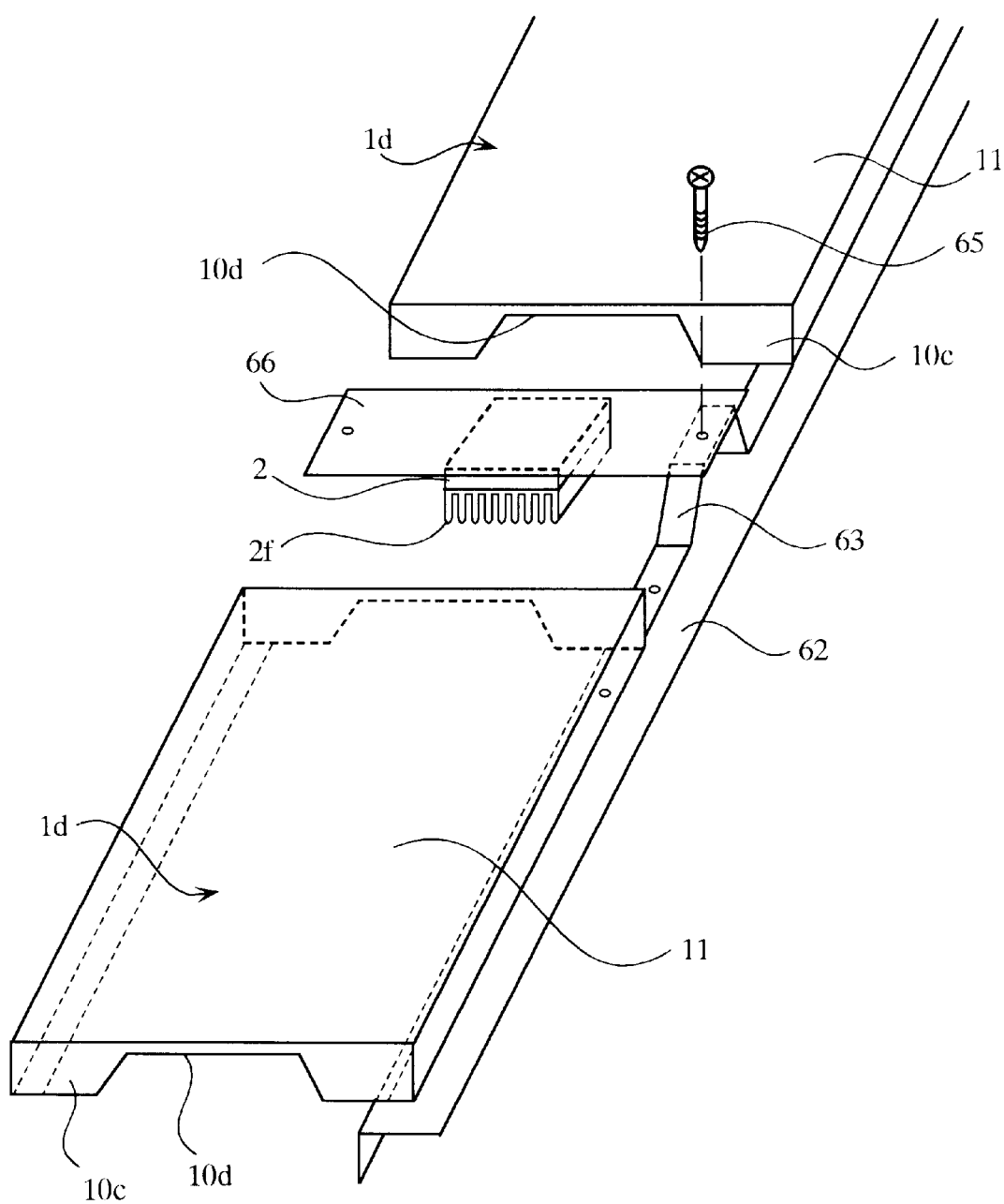
FIG. 26 is a perspective view showing a photo-voltaic apparatus according to a tenth embodiment of the present invention.
Figure 27:
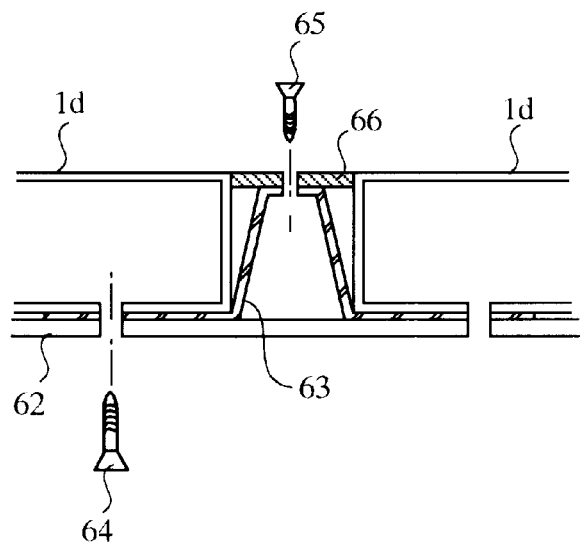
FIG. 27 is a cross-sectional view showing the photo-voltaic apparatus according to the tenth embodiment of the present invention.
Figure 28:
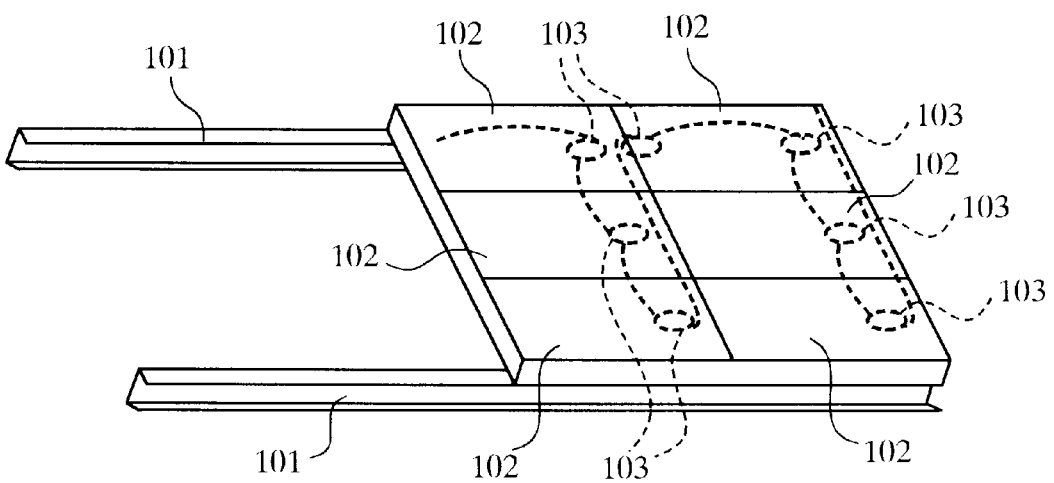
FIG. 28 is an explanatory view of a general photo-voltaic system.
Figure 29:
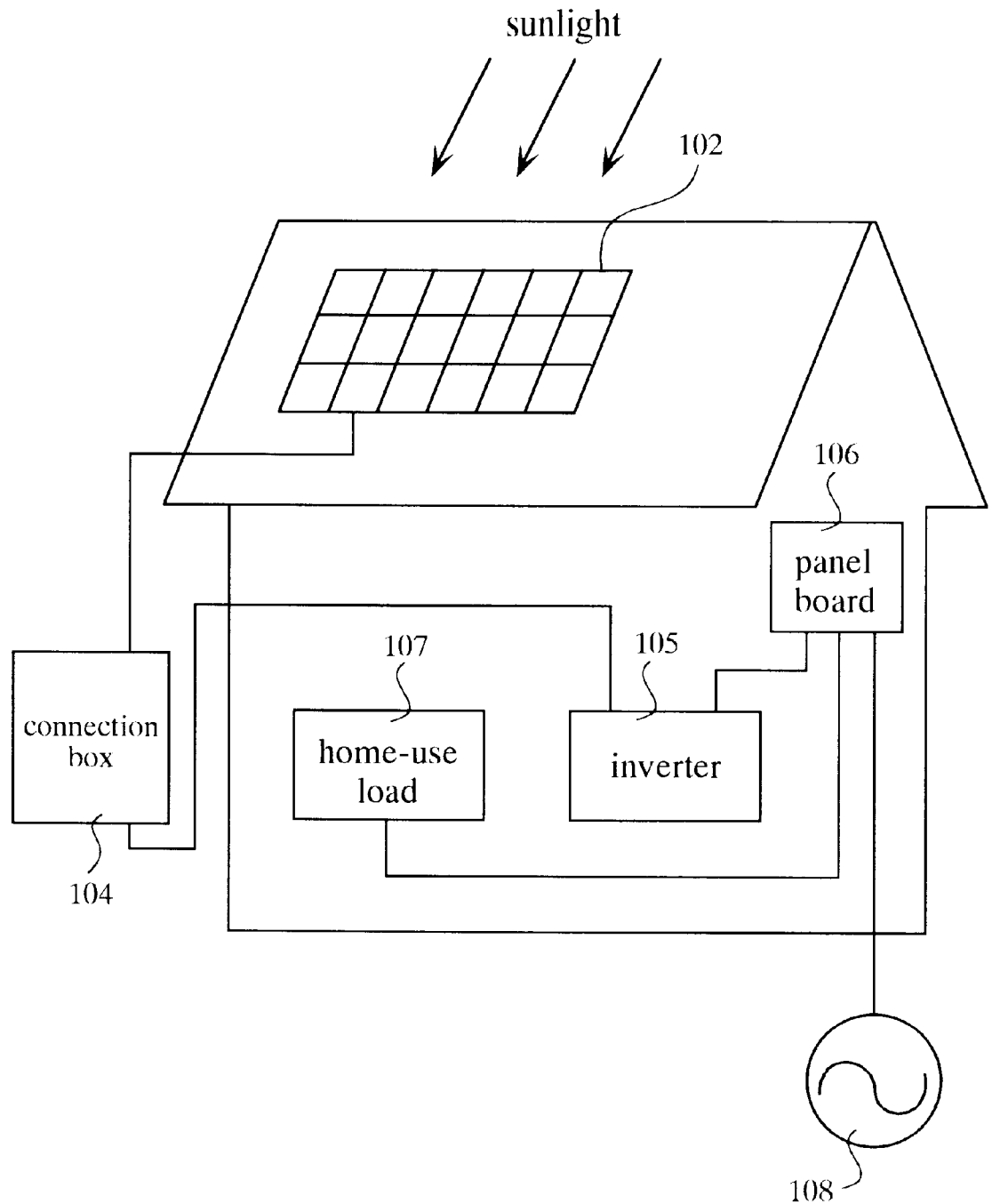
FIG. 29 is an explanatory view of a general photo-voltaic system.

A photo-voltaic module id in a tenth embodiment of the present invention shown in FIGS. 26 and 27 comprises a frame 10c made of aluminum and a photo-voltaic section 11, and is in a flat rectangular shape as a whole. The photo-voltaic section 11 is composed of tempered glass or the like on its light receiving surface, and has a plurality of photo-voltaic cells in its inner part. The photo-voltaic cells are coated with and protected by a resin layer. In the present embodiment, the photo-voltaic module 1d is fixed to a frame 62 mounted on a roof by a screw 64 or the like. An inverter unit 2 is mounted between photo-voltaic modules 1d. A hat type fitting 63 for mounting the inverter unit 2 is fixed to the frame 62. The fitting 63 is fixed on the frame 62 simultaneously with the fixing of the photo-voltaic module 1d. An inverter mounting plate 66 composed of a heat insulating material or the like is fixed to the light receiving surface of the inverter unit 2. The inverter mounting plate 66 is fixed to the fitting 63 by a screw 65, so that the inverter unit 2 is arranged between the photo-voltaic modules 1d. The frame 10c is provided with a notch 10d for forming an air flow path, so that air flows to the inverter unit 2 from the notch 10d, to improve the heat radiating effect of the inverter unit 2. Further, the inverter unit 2 is provided with a heat radiating fin 2f in order to improve the heat radiating effect of the inverter unit 2.

By such construction, replacement work of the inverter unit 2 can be easily performed without removing the photo-voltaic module 1d.

Although the present invention has been described and illustrated in detail, it is clearly understood that the same is by way of illustration and example only and is not to be taken by way of limitation, the spirit and scope of the present invention being restricted only by the terms of the appended claims.

What is claimed is:

1. A photo-voltaic apparatus comprising:

a photo-voltaic module having a plurality of photo-voltaic cells; and an inverter for converting a direct current output generated from said photo-voltaic cells into an alternating current and outputting the alternating current, said inverter being mounted on a surface opposite to the light receiving surface of said photo-voltaic module with a space between said opposite surface and said inverter to permit air flow in said space.

2. The photo-voltaic apparatus according to claim 1, wherein said photo-voltaic module comprises a photo-voltaic section having a plurality of photo-voltaic cells in its inner part and a frame for holding the photo-voltaic section.

3. The photo-voltaic apparatus according to claim 2, further comprising a terminal box provided on said surface opposite to the light receiving surface of said photo-voltaic module and outputting power generated from the photo-voltaic section, a first type connector provided on the output side of the terminal box, and a second type connector provided on said inverter and engaged with said first type connector, the inverter being supported on the photo-voltaic section by engagement of both said connectors.

4. The photo-voltaic apparatus according to claim 3, wherein said inverter is provided with a first type output connector.

5. The photo-voltaic apparatus according to claim 2, wherein said inverter is mounted on a part of said frame.

6. The photo-voltaic apparatus according to claim 5, wherein a frame positioned outside of a position to which said inverter is mounted is provided with a slit for air inflow.

7. The photo-voltaic apparatus according to claim 2, further comprising:

a heat insulting plate mounted on said frame on the opposite side of said light receiving surface of the photo-voltaic module, said inverter unit being mounted on said heat insulating plate.

8. The photo-voltaic apparatus according to claim 1, wherein said inverter unit is mounted on a surface opposite to the light receiving surface of said photo-voltaic module by legs.

9. A photo-voltaic apparatus comprising:

a plurality of photo-voltaic modules each having a plurality of photo-voltaic cells; and inverters each mounted on a photo-voltaic module and converting a direct current output generated from said photo-voltaic cells into an alternating current and outputting the alternating current, said photo-voltaic modules being located with respective parts that overlap each other, an air flow path for cooling said inverters being provided between said photo-voltaic modules.

10. The photo-voltaic apparatus according to claim 9, wherein said photo-voltaic module comprises a photo-voltaic section having a plurality of photo-voltaic cells in its inner part and a frame for holding the photo-voltaic section.

11. The photo-voltaic apparatus according to claim 10, wherein said inverter is mounted on a frame in one of superimposed portions of said photo-voltaic module, a heat radiating fin in the inverter is arranged on the light receiving surface, and a containing section for containing said heat radiating fin of the other photo-voltaic module is provided in the other superimposed portion.

12. The photo-voltaic apparatus according to claim 11, wherein a shading cover is provided on said heat radiating fin.

13. The photo-voltaic apparatus according to claim 10, wherein a heat radiating fin for cooling the photo-voltaic module is further provided on a surface opposite to the light receiving surface of said photo-voltaic module.

14. The photo-voltaic apparatus according to claim 13, wherein said heat radiating fin is provided in a frame for holding the photo-voltaic section.

15. The photo-voltaic apparatus according to claim 14, wherein an inverter is mounted on said heat radiating fin.

16. The photo-voltaic apparatus according to claim 15, wherein a planar section is formed on a surface, which is in contact with the inverter, of said heat radiating fin, an engaging section engaged with a part of said planar section is provided in said inverter, and said inverter is mounted by engagement of the engaging section and the planar section.

17. The photo-voltaic apparatus according to claim 10, wherein a connecting hole provided with an insulating bushing is formed in said frame, to make electrical connection between the photo-voltaic section and the inverter through the connecting hole.

18. The photo-voltaic apparatus according to claim 9, wherein a superimposed section on which said inverter unit is put is formed in the superimposed portion of said photo-voltaic module.

19. The photo-voltaic apparatus according to claim 18, wherein said superimposed section is provided with projections and recesses.

20. A photo-voltaic apparatus comprising:

a plurality of photo-voltaic modules each having a plurality of photo-voltaic cells;

inverters each located between the photo-voltaic modules and converting a direct current output generated from said photo-voltaic cells into an alternating current and outputting the alternating current; and an air flow path provided in said photo-voltaic module and cooling said inverter.

* * * * *

/ (12) EX PARTE REEXAMINATION CERTIFICATE (9410th)

United States Patent
Uchihashi et al.

(10) Number: US 5,951,785 C1
(45) Certificate Issued: Nov. 16, 2012

(54) PHOTO-VOLTAIC APPARATUS

(75) Inventors: Kenji Uchihashi, Amagasaki (JP); Takeo Ishida, Neyagawa (JP); Hitoshi Kishi, Neyagawa (JP); Ryuzo Hagihara, Kadoma (JP)

(73) Assignee: Sanyo Electric Co., Ltd., Osaka-Fu (JP)

Reexamination Request:
No. 90/012,049, Dec. 15, 2011

Reexamination Certificate for:
Patent No.: 5,951,785
Issued: Sep. 14, 1999
Appl. No.: 08/790,116
Filed: Jan. 29, 1997

(30) Foreign Application Priority Data

Jan. 29, 1996 (JP) ........................................ 8-013379
Jan. 29, 1996 (JP) ........................................ 8-013380
Jan. 13, 1997 (JP) ........................................ 9-003983

(51) Int. Cl.
H01L 31/04 (2006.01)
H01L 31/042 (2006.01)
H01L 31/048 (2006.01)
H01L 31/052 (2006.01)
H02M 7/48 (2007.01)

(52) U.S. Cl. .................................... 136/251; 136/246
(58) Field of Classification Search ....................... None
See application file for complete search history.

(56) References Cited

To view the complete listing of prior art documents cited during the proceeding for Reexamination Control Number 90/012,049, please refer to the USPTO's public Patent Application Information Retrieval (PAIR) system under the Display References tab.

*Primary Examiner* — Alan Diamond

(57) ABSTRACT

The present invention is directed to a photo-voltaic apparatus comprising a photo-voltaic module having a plurality of photo-voltaic cells, and an inverter for converting a direct current output generated from the photo-voltaic cells into an alternating current and outputting the alternating current, the inverter being mounted on a surface opposite to the light receiving surface of the photo-voltaic module with a clearance provided therebetween, so that heat self-generated by the inverter can be efficiently radiated, and heat from the photo-voltaic module is not transferred to the inverter.

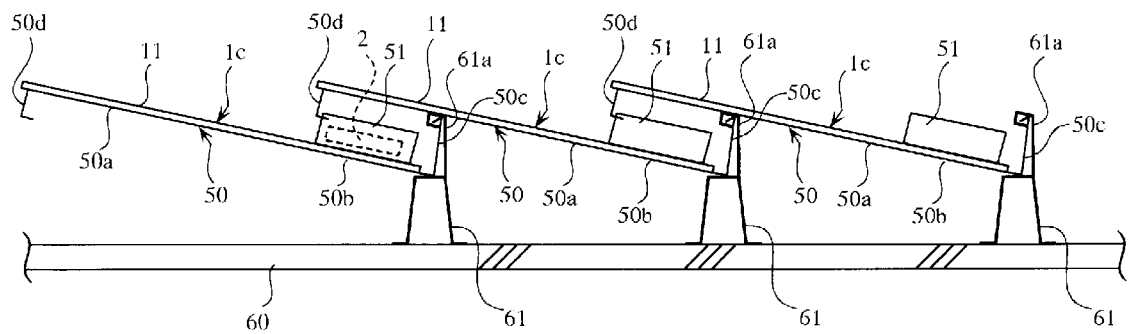

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-20 is confirmed.

New claims 21-49 are added and determined to be patentable.

*21. The photo-voltaic apparatus according to claim 1, further comprising an intermediate material between the surface opposite to the light receiving surface of said module and said inverter.*

*22. The photo-voltaic apparatus according to claim 21, wherein said intermediate material is a heat insulating material.*

*23. The photo-voltaic apparatus according to claim 21, wherein said inverter is mounted on the surface opposite to the light receiving surface by said intermediate material.*

*24. The photo-voltaic apparatus according to claim 22, wherein said inverter is mounted on the surface opposite to the light receiving surface by said intermediate material.*

*25. The photo-voltaic apparatus according to claim 2, wherein said inverter and said opposite surface are free of direct contact.*

*26. The photo-voltaic apparatus according to claim 2, wherein said frame is made of aluminium.*

*27. The photo-voltaic apparatus according to claim 5, wherein one side of said frame to which said inverter is mounted is provided with a slit.*

*28. The photo-voltaic apparatus according to claim 2, wherein said photo-voltaic section has a rectangular shape, and wherein said inverter is attached to one side of said frame.*

*29. The photo-voltaic apparatus according to claim 2, wherein one side of said inverter is attached to said frame.*

*30. The photo-voltaic apparatus according to claim 25, wherein one side of said inverter is attached to one side of said frame.*

*31. The photo-voltaic apparatus according to any of claims 5 and 29, wherein said inverter is attached to said frame by a screw.*

*32. The photo-voltaic apparatus according to claim 2, wherein said frame has a reception portion to hold said photo-voltaic section therein.*

*33. The photo-voltaic apparatus according to claim 2, further comprising: a second frame attached to said frame, and said inverter is held by said second frame.*

*34. The photo-voltaic apparatus according to claim 33, wherein said inverter is attached to said second frame by a screw.*

*35. The photo-voltaic apparatus according to claim 2, further comprising: a fitting to which said inverter is held.*

*36. The photo-voltaic apparatus according to claim 35, wherein said frame is attached to said fitting by a screw.*

*37. The photo-voltaic apparatus according to claim 35, wherein said inverter is attached to said fitting by a screw.*

*38. The photo-voltaic apparatus according to claim 1, further comprising:*
*a terminal box provided on said surface opposite to the light receiving surface of said photo-voltaic module and outputting power generated from the photo-voltaic section.*

*39. The photo-voltaic apparatus according to claim 38, wherein said terminal box is connected to said inverter by a cable.*

*40. The photo-voltaic apparatus according to claim 38, wherein said terminal box is connected to said inverter by two cables.*

*41. The photo-voltaic apparatus according to claim 38, wherein said terminal box is directly attached to said opposite surface of said module by using a heat insulating material.*

*42. The photo-voltaic apparatus according to claim 41, wherein said material is glass wool.*

*43. The photo-voltaic apparatus according to claim 38, wherein said terminal box is made of insulating resin.*

*44. The photo-voltaic apparatus according to claim 43, wherein said insulating resin is ABS.*

*45. The photo-voltaic apparatus according to claim 38, wherein said terminal box is attached near the center of one side of said module.*

*46. The photo-voltaic apparatus according to claim 8, wherein said legs are made of heat insulating material.*

*47. The photo-voltaic apparatus according to claim 20, further comprising a frame fixed to said photo-voltaic modules.*

*48. The photo-voltaic apparatus according to claim 21, wherein said inverters are fixed to said frame.*

*49. A photo-voltaic apparatus comprising:*
*a photo-voltaic module having a plurality of photo-voltaic cells; and*
*an inverter for converting a direct current output generated from said photo-voltaic cells into an alternating current and outputting the alternating current,*
*said inverter mounted on a surface opposite to the light receiving surface of said photo-voltaic module with a space between said surface opposite to the light receiving surface and said inverter to permit air flow in said space,*
*wherein said inverter and said opposite surface are free of direct contact.*

\* \* \* \* \*